(12) United States Patent
Ehsan et al.

(10) Patent No.: US 12,418,034 B1
(45) Date of Patent: Sep. 16, 2025

(54) DEPOSITION OF BIMETALLIC ALLOY COATING ON STAINLESS-STEEL BIPOLAR PLATES

(71) Applicant: King Fahd University of Petroleum and Minerals, Dhahran (SA)

(72) Inventors: Muhammad Ali Ehsan, Dhahran (SA); A. Madhan Kumar, Dhahran (SA); Rami K. Suleiman, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 19/209,209

(22) Filed: May 15, 2025

(51) Int. Cl.
*H01M 8/0228* (2016.01)
*C23C 16/18* (2006.01)
*H01M 8/021* (2016.01)
*H01M 8/1004* (2016.01)

(52) U.S. Cl.
CPC .......... *H01M 8/0228* (2013.01); *C23C 16/18* (2013.01); *H01M 8/021* (2013.01); *H01M 8/1004* (2013.01)

(58) Field of Classification Search
CPC .................................................. H01M 8/0228
See application file for complete search history.

(56) References Cited

U.S. PATENT DOCUMENTS

2011/0262831 A1 10/2011 Dadheech et al.
2014/0127609 A1* 5/2014 Jacobson ............ H01M 4/9033
429/482

FOREIGN PATENT DOCUMENTS

| CN | 101710620 A | 5/2010 |
|---|---|---|
| CN | 112038652 A | 12/2020 |
| CN | 118422143 A | 8/2024 |
| DE | 10 2009 037 206 B4 | 9/2019 |

OTHER PUBLICATIONS

Xin-xian Fang, et a.l, "Corrosion properties of stainless steel 316L/Ni—Cu—P coatings in warm acidic solution", Transactions of Nonferrous Metals Society of China, vol. 25, Issue 8, Aug. 2015, pp. 2594-2600, Abstract Only, 2 pages.

* cited by examiner

*Primary Examiner* — Brian R Ohara
(74) *Attorney, Agent, or Firm* — Oblon, McClelland, Maier & Neustadt, L.L.P.

(57) ABSTRACT

A method of depositing a bimetallic alloy coating onto a bare stainless-steel bipolar plate includes preheating the bare stainless-steel bipolar plate to a temperature ranging from 450° C. to 500° C. Further, the method includes depositing copper (Cu) and nickel (Ni) onto the bare stainless-steel bipolar plate to form a coated stainless-steel bipolar plate. Furthermore, the method includes cooling the coated stainless-steel bipolar plate after terminating the depositing. The deposition is an aerosol assisted chemical vapor deposition of Cu and Ni from a solution containing a mixture of a copper (II) precursor and a nickel (II) precursor for 1 hour (h) to 3 h to form the coated stainless-steel bipolar plate having a coating including a CuNi film having a metal phase including Cu, Ni and CuNi.

20 Claims, 23 Drawing Sheets

DEPOSITION OF BIMETALLIC ALLOY COATING ON STAINLESS-STEEL BIPOLAR PLATES

STATEMENT REGARDING PRIOR DISCLOSURE BY THE INVENTORS

Aspects of the present disclosure are described in Kumar M., et al., "Bimetallic CuNi Alloy Coatings on SS304 Substrate for Bipolar Plates of Proton Exchange Membrane Fuel Cells" published in Volume 7, Issue 11, ACS Applied Energy Materials, which is incorporated herein by reference in its entirety.

STATEMENT OF ACKNOWLEDGEMENT

Support provided by the King Fahd University of Petroleum and Minerals (KFUPM), Saudi Arabia and the Interdisciplinary Research Center for Advanced Materials is gratefully acknowledged.

BACKGROUND

Technical Field

The present disclosure is related to a method of depositing a bimetallic alloy coating. More specifically, the present invention relates to a method of depositing a bimetallic alloy coating onto a bare stainless-steel bipolar plate to form a coated stainless-steel bipolar plate, the bimetallic alloy coating made by the method and proton exchange membranes containing the bimetallic alloy coating.

Description of Related Art

The "background" description provided herein is for the purpose of generally presenting the context of the disclosure. The work of the presently named inventors, to the extent it is described in this background section, as well as aspects of the description which may not otherwise qualify as prior art at the time of filing, are neither expressly nor impliedly admitted as prior art against the present invention.

Discovering and developing alternative energy sources is essential for mitigating issues caused by growing energy consumption and resource depletion. In recent decades, fuel cell technology has drawn much research attention because it is considered the most promising solution to issues caused by fossil fuels, several examples including air pollution, climate change, and the scarcity of energy. As a distinct and well-known clean power source, proton exchange membrane fuel cells (PEM-FCs) are appropriate for low-power devices such as electronics and may meet the requirements for high-power devices such as electric vehicles [See: Manojkumar Balakrishnan; Pranay Shrestha; Nan Ge; ChungHyuk Lee; Kieran F Fahy; Roswitha Zeis; Volker P Schulz; Benjamin D Hatton; Aimy Bazylak. Designing tailored gas diffusion layers with pore size gradients via electrospinning for polymer electrolyte membrane fuel cells. ACS Appl. Energy Mater. 2020, 3, 2695-2707]. PEM-FCs are used in various fields due to the low working temperature, high effectiveness, and rapid launch time [See: Robin Sandström; Guangzhi Hu; Thomas Wågberg. Compositional evaluation of coreduced Fe—Pt metal acetylacetonates as PEM fuel cell cathode catalyst. ACS Appl. Energy Mater. 2018, 1, 7106-7115]. As PEM-FCs directly convert a high percentage of fuel energy into electrical power, they are suitable for various applications where energy efficiency is crucial, such as transportation and stationary power generation. Gas diffusion layers (GDLs), membrane electrode assemblies (MEAs), and bipolar plates (BPs) are the three primary constituents of a PEM-FC [See: Junji Xuan; Yueren Liu; Likun Xu; Shuangfeng Bai; Yonglei Xin; Li Wang; Guodong Zhang; Yan Su; Lili Xue; Li Li. Investigation of acidity on corrosion behavior and surface properties of SS304 in simulated PEMFC cathode environments. Int. J. Hydrogen Energy 2022, 47, 22938-22951].

Bipolar plates are key components of PEM fuel cells, since they play an important role in the durability and complete productivity of full cell stacks, and they are notably multifunctional such that they may eliminate exhaust gas and heat from the device, distribute active gas uniformly throughout the active area, and accumulate electrons produced by fuel cell reactions [See: Xiuping Zhang; Henghui Huang; Jiantao Fan; Yudi Niu; Li Fan; Shaoyi Xu; Hui Li. Gradient structured composite bipolar plates for proton exchange membrane fuel cells. ACS Sustainable Chem. Eng. 2022, 10, 48, 15846-15856]. Bipolar plates constitute approximately half of the fuel cell stack weight and approximately 45% of the cost, therefore choice of constituents for bipolar plates is crucial. Conventional bipolar plates are graphite plates, since graphite exhibits high electrical and thermal conductivity as well as excellent chemical resistance [See: Dhananjai Pangotra; Arne Roth; Volker Sieber; Luciana Vieira. Electrochemical water oxidation to hydrogen peroxide on bipolar plates. ACS Sustainable Chem. Eng. 2023, 11, 2680-2685]. However, lack of mechanical strength and relatively high processing costs pose a significant restriction on graphite plates in the fuel cell industry [See: Emile Haye; Fabien Deschamps; Giuseppe Caldarella; Marie-Laure Piedboeuf; Adeline Lafort; Hugues Cornil; Jean-Francois Colomer; Jean-Jacques Pireaux; Nathalie Job. Formable chromium nitride coatings for proton exchange membrane fuel cell stainless steel bipolar plates. Int. J. Hydrogen Energy 2020, 45, 15358-5365]. Therefore, in recent years, researchers have searched for more suitable bipolar plate materials.

Due to impermeability, low processing costs, high thermal and electrical conductivities, and good mechanical strength, metallic materials are viable bipolar plate candidates for PEM fuel cells. The primary metal bipolar plate materials thoroughly studied include tin (Ti), nickel (Ni), aluminium (Al), copper (Cu), stainless steel (SS), and the corresponding alloys of these metals [See: Teuku. H.; Alshami, I.; Goh, J.; Masdar, M. S.; Loh, K. S. Review on bipolar plates for low-temperature polymer electrolyte membrane water electrolyzer. Int. J. Energy Res. 2021, 45, 20583-600]. Considering the physical and chemical characteristics, cost, and reserves, 304 SS bipolar plates are considered most promising for the automotive fuel cell. The electrolyte concentration and pH level have a major impact on the chemical durability of the SS plates under PEM fuel cell operating conditions. A primary issue with bare SS plates is corrosion under the aggressive environment of the PEM fuel cell. In addition, the interfacial contact resistance (ICR) between SS bipolar plates and gas diffusion layers increases due to the byproducts generated from corrosion such as iron oxides [See: Yu Leng; Pingwen Ming; Daijun Yang; Cunman Zhang. Stainless steel bipolar plates for proton exchange membrane fuel cells: Materials, flow channel design and forming processes. J. Power Sources 2020, 451, 227783. See: Jincan Cui; Jingcheng Xu; Huixin Xiu; Heng Wang; Jing L I; Junhe Yang. Graphene-Dominated Hybrid Coatings with Highly Compacted Structure on Stainless Steel Bipolar Plates. ACS Appl. Mater. Interfaces 2022, 14, 37059-37067].

To improve on the overall effectiveness and service life of the SS bipolar plates under aggressive PEM fuel cell operating conditions, various surface modifications and protective coatings have been developed over the past decade [See: Liu, R.; Jia, Q.; Zhang, B.; Lai, Z.; Chen L. Protective coatings for metal bipolar plates of fuel cells: a review. Int. J. Hydrogen Energy 2022, 47, 22915-37], among which metal-based coatings with high electrical conductivity have been explored the most, especially coatings processed via physical and chemical vapor deposition (PVD and CVD), plasma coatings, and electroplating [See: Avinash Ingle, V.; Raja, V. S.; Rangarajan, J.; Mishra, P. Corrosion resistant quaternary Al—Cr-Mo-N coating on type 316L stainless steel bipolar plates for proton exchange membrane fuel cells. Int. J. Hydrogen Energy 2020, 45, 3094-3107]. Carbon films were deposited on an SS bipolar plate using plasma-assisted CVD and investigated the anodic polarization performance to validate the electrochemical stability under PEM fuel cell operating conditions [See: Fukutsuka, T.; Yamaguchi, T.; Miyano, S. L.; Matsuo, Y.; Sugie, Y.; Ogumi, Z. Carbon-coated stainless steel as PEFC bipolar plate material. J. Power Sources 2007, 174, 199-205]. CVD-processed tantalum (Ta) coatings were deposited on SS BPs, and the corrosion test results verified the enhanced anticorrosion activity of the Ta coatings in PEM fuel cell environments [Manso, A. P.; Marzo, F. F.; Garicano, X.; Alegre, C.; Lozano, A.; Barreras, F. Corrosion behavior of tantalum coatings on AISI 316L stainless steel substrate for bipolar plates of PEM fuel cells. Int. J. Hydrogen Energy 2020, 45, 20679-20691].

The CVD method has been widely utilized in various applications owing to its low initial investment and operational cost. A major advantage of CVD is that the composition and thickness of high-purity coatings can be controlled in a fairly simple way [See: Che, J.; Yi, P.; Peng. L.; Lai, X. Impact of pressure on carbon films by PECVD toward high deposition rates and high stability as metallic bipolar plate for PEMFCs, Int. J. Hydrogen Energy 2020, 5, 16277-16286], therefore numerous combination of CVD with other procedures has been developed over the past few years, including atomic layer CVD, plasma-enhanced CVD and low-pressure CVD [See: Madhan Kumar, A.; Muhammad Ali Ehsan; Rami K Suleiman; Abbas Saeed Hakeem. AACVD processed binary amorphous NiVOx coatings on Cu substrates: Surface characterization and corrosion resistant performance in saline medium. Coll. Surf. A: Physicochem. Eng. Aspects 2022, 633, 127893]. However, each developed technique has its own limitations. For example, atomic layer CVD suffers from a slow deposition rate and high precursor costs, making it less efficient for large-scale applications. Plasma-enhanced CVD may introduce plasma-induced damage and non-uniform deposition, especially on complex surfaces. Low-pressure CVD, though effective for high-purity films, requires a complex operation including high processing temperatures and vacuum systems, where temperature-sensitive material is not applicable. In the present disclosure, one objective is to develop a CVD process to coat a bimetallic coating on a 304 SS bipolar plates that may circumvent the drawbacks, such as slow deposition rate, high processing temperatures, high-cost factor, of the materials known in the art.

SUMMARY

In an exemplary embodiment, a method of depositing a bimetallic alloy coating onto a bare stainless-steel bipolar plate is described. The method may include preheating the bare stainless-steel bipolar plate, where copper (Cu) and nickel (Ni) may be deposited to form a coated stainless-steel bipolar plate. Furthermore, the method may include cooling the coated stainless-steel bipolar plate after terminating the depositing. The depositing is preferably an aerosol assisted chemical vapor deposition from a solution containing copper (II) precursor and nickel (II) precursor for a sufficient amount of time, forming a CuNi film coating having a metal phase including Cu, Ni and CuNi on the stainless-steel bipolar plate.

In a further embodiment, the bimetallic alloy coating exhibits an island-like topographical structure, where a grain boundary is observed.

In a further embodiment, the copper (II) precursor is at least one selected from the group including copper trifluoroacetylacetonate, copper hexafluoroacetylacetonate, copper dimethyldithiocarbamate, copper bis(2-hydroxyethyl) dithiocarbamate, copper diethyl-dithiocarbamate and copper acetylacetonate. Further, the nickel (II) precursor is at least one selected from the group including nickel nitrate, nickel chloride, nickel sulfate, nickel acetate, nickel (II) bis(triphenylphosphine)dichloride, nickel acetylacetonate, and nickelocene.

In a further embodiment, the CuNi film has a thickness of 0.5 to 2.5 micrometer (μm).

In a further embodiment, the CuNi film contains cubic crystal units.

In a further embodiment, the CuNi film includes a compact microstructure in cross-sectional area.

In a further embodiment, copper in the CuNi film has a molar percentage range from 40% to 48%, where nickel has a molar percentage range from 40% to 48%.

In a further embodiment, the CuNi film has a surface roughness measured in atomic force microscopy (AFM) as average value of profile deviation from the mean line at a range of 0.008 μm to 0.030 μm.

In a further embodiment, the CuNi film has a surface roughness measured in AFM as root mean square deviation of profile at a range of 1.5 μm to 4.5 μm.

In a further embodiment, the coated stainless-steel bipolar plate has a homogenous surface coating measured in AFM as an average peak to valley height at a range of 1.5 μm to 3 μm.

In a further embodiment, the coated stainless-steel bipolar plate exhibits an anode corrosion potential ($E_{corr}$) at a range of −0.016 volt (V) to −0.014 V under a proton exchange membrane fuel cell anodic operating environment. Further, the coated stainless-steel bipolar plate exhibits a cathode corrosion potential ($E_{corr}$) at a range of −0.032 V to −0.005 V under a proton exchange membrane fuel cell cathodic operating environment.

In a further embodiment, the coated stainless-steel bipolar plate exhibits an anode corrosion current density at a range of 0.14 microamperes per square centimeter (μA cm$^{-2}$) to 0.18 μA cm$^{-2}$ under the proton exchange membrane fuel cell anodic operating environment. Further, the coated stainless-steel bipolar plate exhibits a cathode corrosion current density at a range of 0.12 μA cm$^{-2}$ to 0.85 μA cm$^{-2}$ under the proton exchange membrane fuel cell cathodic operating environment. In a further embodiment, the coated stainless-steel bipolar plate exhibits a compulsory current density less than 1 μA cm$^{-2}$ under the proton exchange membrane fuel cell anodic operating environment, and the proton exchange membrane fuel cell cathodic operating environment.

In a further embodiment, the coated stainless-steel bipolar plate has a surface without visible defects and cracks in the proton exchange membrane fuel cell anodic operating environment.

In a further embodiment, the coated stainless-steel bipolar plate exhibits an anode impedance at a range of $2 \times 10^4$ ohm square centimeters ($\Omega\ cm^2$) to $1 \times 10^5\ \Omega\ cm^2$ under the proton exchange membrane fuel cell anodic operating environment. Further, the coated stainless-steel bipolar plate exhibits a cathode impedance at a range of $2 \times 10^3\ \Omega\ cm^2$ to $3 \times 10^4\ \Omega\ cm^2$ under the proton exchange membrane fuel cell cathodic operating environment.

In a further embodiment, the coated stainless-steel bipolar plate exhibits an interfacial contact resistance (ICR) at a range of 5 milliohm square centimeters ($m\Omega\ cm^2$) to 10 $m\Omega\ cm^2$ under a compaction force at a range of 100 newton per square centimeter ($N\ cm^{-2}$) to 200 $N\ cm^{-2}$.

In another exemplary embodiment, a proton exchange membrane fuel cell is described. The fuel cell includes a plurality of membrane electrode assemblies each having an anode and a cathode separated by a proton exchange membrane, a plurality of gas diffusion layers and a plurality of the coated stainless-steel bipolar plates having the microgranular bimetallic alloy coating. In further embodiment, the coated stainless-steel bipolar plates of the proton exchange membrane are conductive and have a bimetallic alloy coating layer including Cu, Ni and CuNi.

In a further embodiment, each of the membrane electrode assemblies of the proton exchange membrane is sandwiched by two gas diffusion layers, further sandwiched by two coated stainless-steel bipolar plates.

In a further embodiment, the proton exchange membrane fuel cell of further includes a fuel cell stack having the proton exchange membrane fuel cell connected via contact of the coated stainless-steel bipolar plates.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
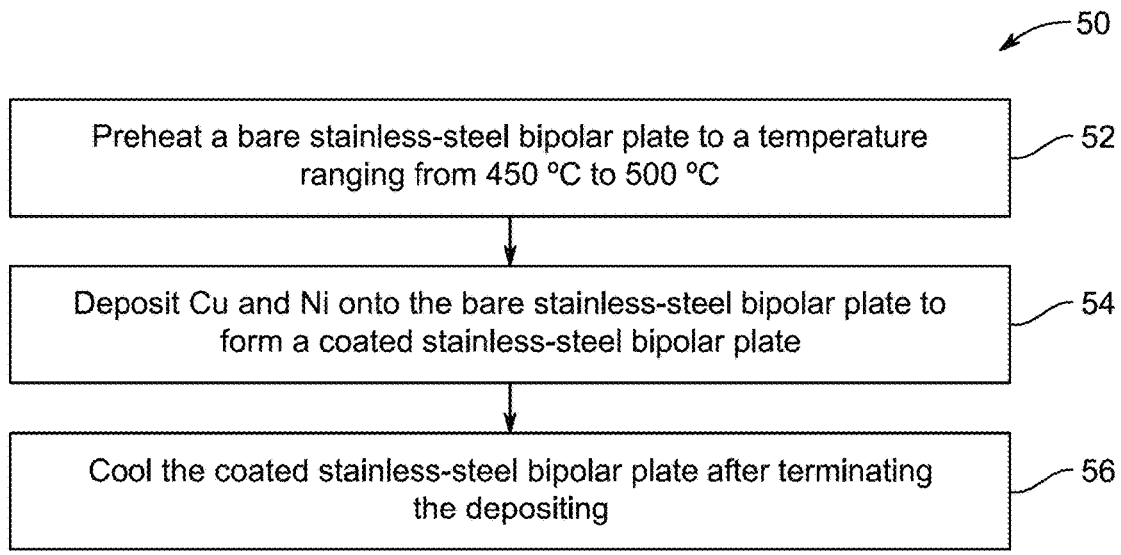
FIG. 1 is a schematic flowchart of a method of depositing a bimetallic alloy coating onto a bare stainless-steel bipolar plate, according to certain embodiments.

When describing the present disclosure, the terms used are to be construed in accordance with the following definitions, unless a context dictates otherwise.

Embodiments of the present invention will now be described more fully hereinafter with reference to the accompanying drawings wherever applicable, in that some, but not all, embodiments of the disclosure are shown.

In the drawings, like reference numerals designate identical or corresponding parts throughout the several views. Further, as used herein, the words 'a,' 'an' and the like generally carry a meaning of 'one or more,' unless stated otherwise.

Furthermore, the terms 'approximately,' 'approximate,' 'about,' and similar terms generally refer to ranges that include the identified value within a margin of 20%, 10%, or preferably 5%, and any values therebetween.

As used herein, the term 'room temperature' refers to a temperature range of '25 degrees Celsius (° C.)+3° C. in the present disclosure.

As used herein, the term 'alloy' refers to a material composed of two or more metals, or a metal and a non-metal, combined to improve certain properties such as strength, corrosion resistance, or conductivity.

As used herein, the term 'bipolar plates' refers to conductive plates used in fuel cells that separate individual cells in a stack and allow the distribution of gases to the anode and cathode while conducting electricity between cells. A bipolar plate preferably connects the entire surface of one cathode (electrically positive) and the entire surface of one anode (electrically negative) of the next cell, hence the name bipolar, and provides a series electrical connections between adjacent cells.

As used herein, the term 'chemical vapor deposition' refers to a process used to create thin films or coatings on a substrate by reacting gaseous precursors at elevated temperatures to deposit material in a solid state.

As used herein, the term 'average surface roughness' refers to the average deviation of the surface profile from the mean line, commonly used as a measure of the texture of a surface. As used herein, the term 'root mean square deviation' refers to the square root of the average of the squared deviations from the mean, often used to describe surface roughness or statistical variability.

As used herein, the term 'average peak to valley height' refers to the average vertical distance between the highest peak and the lowest valley in a surface profile.

As used herein, the term 'anode corrosion potential' refers to the electrochemical potential of the anode in a fuel cell at which the corrosion of the anode material is occurring.

As used herein, the term 'cathode corrosion potential' refers to the electrochemical potential of the cathode in a fuel cell at which the corrosion of the cathode material is occurring.

As used herein, the term 'anode corrosion current density' refers to the rate of corrosion at the anode, measured as the amount of current per unit area generated by the oxidation of the anode material.

As used herein, the term 'cathode corrosion current density' refers to the rate of corrosion at the cathode, measured as the amount of current per unit area generated by the reduction of oxygen at the cathode.

As used herein, the term 'anode impedance' refers to the opposition to the flow of alternating current (AC) through the anode, related to the anode's ability to conduct current.

As used herein, the term 'cathode impedance' refers to the opposition to the flow of alternating current (AC) through the cathode, related to the cathode's ability to conduct current. As used herein, the term 'interfacial contact resistance (ICR)' refers to the resistance encountered at the interface between two materials, such as the contact between a bipolar plate and the membrane electrode assembly in a fuel cell.

As used herein, the term 'compaction force' refers to the mechanical force applied to compress the fuel cell stack, ensuring proper contact between the components and reducing interfacial resistance.

A weight percent of a component, unless specifically stated to the contrary, is based on the total weight of the formulation or composition in which the component is included. For example, if a particular element or component in a composition or article is said to have 5 wt. %, it is understood that this percentage is in relation to a total compositional percentage of 100%.

The present disclosure is intended to include all hydration states of a given compound or formula, unless otherwise noted or when heating a material.

An aspect of the present disclosure is directed to the preparation of CuNi alloy coatings on SS304 bipolar plates using chemical vapor deposition to enhance corrosion resistance, reduce interfacial contact resistance, and maintain high conductivity for improved performance in proton exchange membrane fuel cells (PEM-FCs).

A bimetallic alloy film is described. In a further embodiment, the bimetallic metal may include, but is not limited to, Cu—Fe, Cu—Cr, Cu—Co, Cu—Mn, Cu—Sn, Cu—Zn, Cu—Ag, Cu—Al, Cu—Ti, Cu—W, Cu—Mo, Cu—Nb, Cu—Pd, Cu—Pt, Cu—V, Ni—Fe, Ni—Cr, Ni—Co, Ni—Mn, Ni—Mo, Ni—W, Ni—Al, Ni—Ti, Ni—V, Ni—Nb, Ni—Pd, Ni—Pt, Ni—Sn, Ni—Zn, and Ni—Ag. In a preferred embodiment, bimetallic metal is Cu—Ni. In a further embodiment, the CuNi film may include crystalline phases, but is not limited to Quartz, Calcite, Hematite, Magnetite, Goethite, Dolomite, Albite, Anorthite, Pyrite, Fluorite, Halite, Barite, Apatite, Rutile, and Zircon. In a preferred embodiment, the CuNi film exhibits a crystallinity includes a plurality of cubic crystal units.

In a further embodiment, the CuNi film consists essentially of sheet morphologies, preferably nanosheets, although other morphologies such as nanowires, nanospheres, nanocrystals, nanorectangles, nanotriangles, nanopentagons, nanohexagons, nanoprisms, nanodisks, nanocubes, nanoribbons, nanoblocks, nanotoroids, nanodiscs, nanobarrels, nanogranules, nanowhiskers, nanoflakes, nanofoils, nanopowders, nanoboxes, nanobeads, nanobelts, nanourchins, nanoflowers, nanostars, tetrapods, and their mixtures thereof are also possible. In a preferred embodiment, the CuNi film has homogeneous, compact, and crack-free coatings including a compact microstructure in cross-sectional area. The CuNi film is a continuous coating without bare spots and with agglomerated grains in various sizes with an average agglomeration size at a range of 50 to 200 nm. The CuNi film has a dense and continuous layer of tightly packed granular features. The CuNi film has a polyhedral shape with some visible facets, where grain boundaries are well defined, and agglomerations are visible. In a preferred embodiment, the bimetallic alloy coating exhibits an island-like topographical structure having a grain boundary. In some embodiment, the CuNi film has a thickness ranging from 0.5 to 2.5 μm, preferably 1 to 2.5 μm, preferably 1.4 to 2.5 μm, preferably 1.6 to 2.5 μm, preferably 1.8 to 2.5 μm, preferably 2.0 to 2.5 μm, preferably 2.2 to 2.5 μm, preferably 2.4 to 2.5 μm. In a preferred embodiment, the CuNi film has a thickness of 0.9 to 2 μm.

In a further embodiment, the CuNi film includes copper in a molar percentage range from 40% to 48%, preferably 41% to 48%, preferably 42% to 48%, preferably 43% to 48%, preferably 44% to 48%, preferably 45% to 48%, preferably 46% to 48%, preferably 47% to 48%. In a preferred embodiment, the CuNi-1 h film includes copper in a molar percentage of 47%. In another preferred embodiment, the CuNi-2 h film includes copper in a molar percentage of 47.9%. In another preferred embodiment, the CuNi-3 h film includes copper in a molar percentage of 49.2%.

In a further embodiment, the CuNi film includes nickel in a molar percentage range from 40% to 48%, preferably 41% to 48%, preferably 42% to 48%, preferably 43% to 48%, preferably 44% to 48%, preferably 45% to 48%, preferably 46% to 48%, preferably 47% to 48%. In a preferred embodiment, the CuNi-1 h film includes nickel in a molar percentage of 50.5%. In a preferred embodiment, the CuNi-2 h film includes nickel in a molar percentage of 49.1%. In a preferred embodiment, the CuNi-3 h film includes nickel in a molar percentage of 48.8%.

In a further embodiment, the CuNi film has a surface roughness measured in AFM as average value of profile deviation from the mean line at a range of 0.008 to 0.030 μm, preferably 0.010 to 0.030 μm, preferably 0.015 to 0.030 μm, preferably 0.020 to 0.030 μm, preferably 0.025 to 0.030 μm. In a preferred embodiment, the average surface roughness is 0.0112 μm for CuNi-1 h, 0.0184 μm for CuNi-2 h, and 0.0306 μm for CuNi-3 h. In a further embodiment, the CuNi film has a surface roughness measured in AFM as root mean square deviation of profile at a range of 1.5 to 4.5 μm, preferably 2.0 to 4.5 μm, preferably 2.5 to 4.5 μm, preferably 3.0 to 4.5 μm, preferably 3.5 to 4.5 μm. In a preferred embodiment, root mean square deviation is 1.8652 μm for CuNi-1 h, 2.9321 μm for CuNi-2 h, and 4.1256 μm for CuNi-3 h. In a further embodiment, the coated stainless-steel bipolar plate has a homogenous surface coating measured in AFM as an average peak to valley height at a range of 1.5 to 3 μm, preferably 1.7 to 3 μm, preferably 2.0 to 3 μm, preferably 2.4 to 3 μm, preferably 2.8 to 3 μm. In a preferred embodiment, average peak to valley height is 1.5952 μm for CuNi-1 h, 2.5384 μm for CuNi-2 h, and 2.9654 μm for CuNi-3 h.

FIG. 1A illustrates a schematic flow chart of a method 50 of depositing a bimetallic alloy coating onto a bare stainless-steel bipolar plate. The order in which the method 50 is described is not intended to be construed as a limitation, and any number of the described method steps can be combined to implement the method 50. Additionally, individual steps may be removed or skipped from the method 50 without departing from the spirit and scope of the present disclosure.

At step 52, the method 50 includes preheating the bare stainless-steel bipolar plate to a temperature ranging from 450° C. to 500° C. In a further embodiment, the bare stainless-steel bipolar plate may include, but is not limited to, SS301, SS302, SS303, SS305, SS309, SS310, SS314, SS316, SS316L, SS317, SS317L, SS321, SS330, SS347, SS348, SS384, SS410, SS416, SS420, SS430, SS431, SS440A, SS440B, SS440C, SS904L, SS2205 duplex, SS2507 super duplex, SS201, SS202, SS204, SS205, SS214, SS215, SS224, SS225, SS230, SS232, SS240, SS241, SS242, SS248, SS249, SS301L, SS302HQ, SS303Se, SS304L, SS305L, SS309S, SS310S, SS316Ti, SS317Ti, SS409, SS436, SS444, and ferritic alloys such as 18Cr-2Mo and 22Cr-5Ni. In a preferred embodiment, the bare stainless-steel bipolar plate is SS304. In a further embodiment, preheating temperature may vary from 460° C. to 500° C., preferably 470° C. to 500° C., preferably 480° C. to 500° C., preferably 490° C. to 500° C. In a preferred embodiment, preheating temperature is 475° C.

At step 54, the method 50 includes depositing Cu and Ni onto the bare stainless-steel bipolar plate to form a coated stainless-steel bipolar plate. In a further embodiment, deposition may be done by techniques such as chemical vapor deposition (CVD), atomic layer deposition (ALD), physical vapor deposition (PVD), sputtering, thermal evaporation, electron beam evaporation, pulsed laser deposition (PLD), molecular beam epitaxy (MBE), electroplating, electroless plating, spray pyrolysis, sol-gel deposition, dip coating, spin coating, magnetron sputtering, ion beam deposition, plasma-enhanced chemical vapor deposition (PECVD), thermal spraying, cold spraying, and screen printing. In a preferred embodiment, deposition is done by aerosol assisted chemical vapor deposition method. In a preferred embodiment, the depositing is aerosol assisted chemical vapor deposition of Cu and Ni from a solution containing a mixture of a copper (II) precursor and a nickel (II) precursor for 1 to 3 h to form the coated stainless-steel bipolar plate having a coating comprising a CuNi film having a metal phase consisting of Cu, Ni and CuNi.

In a further embodiment, the copper (II) precursor is at least one selected from the group consisting of copper trifluoroacetylacetonate, copper hexafluoroacetylacetonate, copper dimethyldithiocarbamate, copper bis(2-hydroxyethyl)dithiocarbamate, copper diethyl-dithiocarbamate and copper acetylacetonate. In a further embodiment, the copper (II) precursor may include, but is not limited to, copper (II) nitrate, copper (II) chloride, copper (II) sulfate, copper (II) oxide, copper (II) carbonate, copper (II) bromide, copper (II) fluoride, copper (II) phosphate, copper (II) formate, copper (II) propionate, copper (II) stearate, copper (II) benzoate, copper (II) laurate, copper (II) salicylate, copper (II) gluconate, copper (II) tartrate, copper (II) oxalate, copper (II) citrate, copper (II) ethylenediamine complex, and copper (II) 2-ethylhexanoate. In a preferred embodiment, the copper (II) precursor is $Cu(acac)_2$.

In a further embodiment, the nickel (II) precursor is at least one selected from the group consisting of nickel nitrate, nickel chloride, nickel sulfate, nickel acetate, nickel (II) bis(triphenylphosphine)dichloride, nickel acetylacetonate, and nickelocene. In a further embodiment, the nickel (II) precursor may include, but is not limited to, nickel (II) carbonate, nickel (II) oxide, nickel (II) bromide, nickel (II) fluoride, nickel (II) phosphate, nickel (II) formate, nickel (II) propionate, nickel (II) stearate, nickel (II) benzoate, nickel (II) laurate, nickel (II) salicylate, nickel (II) gluconate, nickel (II) tartrate, nickel (II) oxalate, nickel (II) citrate, nickel (II) ethylenediamine complex, nickel (II) 2-ethylhexanoate, nickel (II) acetylacetonate hydrate, nickel (II) succinate, and nickel (II) dimethyldithiocarbamate. In a preferred embodiment, nickel (II) precursor is $Ni(acac)_2$ At step 56, the method 50 includes cooling the coated stainless-steel bipolar plate after terminating the depositing. In a further embodiment, cooling temperature may vary from 20-25° C., preferably 18-27° C., preferably 19-24° C., preferably 21-26° C., preferably 22-28° C. In a preferred embodiment, coated stainless-steel bipolar plate is cooled at room temperature.

In a further embodiment, the coated stainless-steel bipolar plate exhibits an anode corrosion potential ($E_{corr}$) at a range of −0.016V to −0.014V, preferably −0.016V to −0.015V, preferably −0.0155V to −0.0145V, preferably −0.0152V to −0.0143V, preferably −0.0158V to −0.0142V, preferably −0.015V to −0.014V under a proton exchange membrane fuel cell anodic operating environment. In a preferred embodiment, anode corrosion potential ($E_{corr}$) is −0.014V. In a further embodiment, an anodic operating environment may have potential ranging from −0.01V to −0.5V, preferably −0.05V to −0.5V, preferably −0.1V to −0.5V, preferably −0.2V to −0.5V, preferably −0.3V to −0.5V, preferably −0.4V to −0.5V. In a preferred embodiment, an anodic operating environment has potential of −0.1V.

In a further embodiment, the coated stainless-steel bipolar plate exhibits a cathode corrosion potential ($E_{corr}$) at a range of −0.032V to −0.005V, preferably −0.032V to −0.025V, preferably −0.028V to −0.020V, preferably −0.022V to −0.015V, preferably −0.018V to −0.010V, preferably −0.015V to −0.005V under a proton exchange membrane fuel cell cathodic operating environment. In a preferred embodiment, cathode corrosion potential ($E_{corr}$) is −0.005V. In a further embodiment, a cathodic operating environment may have potential ranging from 0.01V to 0.8V, preferably 0.05V to 0.8V, preferably 0.1V to 0.8V, preferably 0.2V to 0.8V, preferably 0.3V to 0.8V, preferably 0.4V to 0.8V, preferably 0.5V to 0.8V, preferably 0.6V to 0.8V, preferably 0.7V to 0.8V. In a preferred embodiment, a cathodic operating environment has potential of 0.6V.

In a further embodiment, the coated stainless-steel bipolar plate exhibits an anode corrosion current density at a range of 0.14 to 0.18 $\mu A\ cm^{-2}$, preferably 0.14 to 0.16 $\mu A\ cm^{-2}$, preferably 0.15 to 0.17 $\mu A\ cm^{-2}$, preferably 0.145 to 0.175 $\mu A\ cm^{-2}$, preferably 0.16 to 0.18 $\mu A\ cm^{-2}$, preferably 0.145 to 0.165 $\mu A\ cm^{-2}$ under the proton exchange membrane fuel cell anodic operating environment. In a preferred embodiment, anode corrosion current density is 0.147 $\mu A\ cm^{-2}$. In a further embodiment, the coated stainless-steel bipolar plate exhibits a cathode corrosion current density at a range of 0.12 to 0.85 $\mu A\ cm^{-2}$, preferably 0.12 to 0.30 $\mu A\ cm^{-2}$, preferably 0.25 to 0.50 $\mu A\ cm^{-2}$, preferably 0.35 to 0.60 $\mu A\ cm^{-2}$, preferably 0.50 to 0.70 $\mu A\ cm^{-2}$, preferably 0.60 to 0.85 $\mu A\ cm^{-2}$ under the proton exchange membrane fuel cell cathodic operating environment. In a preferred embodiment, cathode corrosion current density is 0.125 $\mu A\ cm^{-2}$. In a preferred embodiment, the coated stainless-steel bipolar plate exhibits a compulsory current density less than 1 $\mu A/cm^2$ under the proton exchange membrane fuel cell anodic operating environment, and the proton exchange membrane fuel cell cathodic operating environment. In a preferred embodiment, the coated stainless-steel bipolar plate has a surface without visible defects and cracks in the proton exchange membrane fuel cell anodic operating environment.

In a further embodiment, the coated stainless-steel bipolar plate exhibits an anode impedance at a range of $2\times10^4$ to $1\times10^5$ $\Omega\ cm^2$, preferably $2\times10^4$ to $4\times10^4$ $\Omega\ cm^2$, preferably $3\times10^4$ to $6\times10^4$ $\Omega\ cm^2$, preferably $4\times10^4$ to $7\times10^4$ $\Omega\ cm^2$, preferably $5\times10^4$ to $8\times10^4$ $\Omega\ cm^2$, preferably $6\times10^4$ to $1\times10^5$ $\Omega\ cm^2$ under the proton exchange membrane fuel cell anodic operating environment. In a preferred embodiment, anode impedance is 92567 $\Omega\ cm^2$. In a further embodiment, the coated stainless-steel bipolar plate exhibits a cathode impedance at a range of $2\times10^3$ to $3\times10^4$ $\Omega\ cm^2$, preferably $2\times10^3$ to $5\times10^3$ $\Omega\ cm^2$, preferably $5\times10^3$ to $1\times10^4$ $\Omega\ cm^2$, preferably $1\times10^4$ to $1.5\times10^4$ $\Omega\ cm^2$, preferably $1.5\times10^4$ to $2.5\times10^4$ $\Omega\ cm^2$, preferably $2\times10^4$ to $3\times10^4$ $\Omega\ cm^2$ under the proton exchange membrane fuel cell cathodic operating environment. In a preferred embodiment, cathode impedance is 20790 $\Omega\ cm^2$.

In a further embodiment, the coated stainless-steel bipolar plate exhibits an interfacial contact resistance (ICR) at a range of 5 to 10 $m\Omega\ cm^2$, preferably 5 to 6 m (2 $cm^2$, preferably 6 to 7 $m\Omega\ cm^2$, preferably 7 to 8 $m\Omega\ cm^2$, preferably 8 to 9 m (2 $cm^2$, preferably 9 to 10 m (2 $cm^2$ under a compaction force at a range of 100 to 200 N $cm^{-2}$, preferably 100 to 120 N $cm^{-2}$, preferably 120 to 140 N $cm^2$, preferably 140 to 160 N $cm^{-2}$, preferably 160 to 180 N $cm^{-2}$, preferably 180 to 200 N $cm^{-2}$. In a preferred embodiment, interfacial contact resistance (ICR) is 5 $m\Omega\ cm^2$ under a compaction force of 150 N $cm^{-2}$.

A proton exchange membrane fuel cell includes a plurality of membrane electrode assemblies each having an anode and a cathode separated by a proton exchange membrane, a plurality of gas diffusion layers, a plurality of the coated stainless-steel bipolar plates having the microgranular bimetallic alloy coating. The proton exchange membrane fuel cell includes a fuel cell stack having the proton exchange membrane fuel cell connected via contact of the coated stainless-steel bipolar plates. In another embodiment, the coated stainless-steel bipolar plates are conductive and have a bimetallic alloy coating layer consisting of Cu, Ni and CuNi. In another preferred embodiment, each of the membrane electrode assemblies is sandwiched by two gas diffusion layers, further sandwiched by two coated stainless-steel bipolar plates.

The following examples are provided solely for illustration and are not to be construed as limitations of the present disclosure, as many variations thereof are possible without departing from the spirit and scope of the present disclosure.

EXAMPLES

The following examples demonstrate a bimetallic copper-nickel alloy coating as described herein. The examples are provided solely for illustration and are not to be construed as limitations of the present disclosure, as many variations thereof are possible without departing from the spirit and scope of the present disclosure.

Example 1: Chemicals and Materials

Cu (II) acetylacetonate ($Cu(acac)_2 \geq 99.9\%$), and Ni (II) acetylacetonate ($Ni(acca)_2$, 95%) were obtained from Sigma-Aldrich. Without any additional purification, all other analytical-grade chemicals were used exactly as they were received.

Example 2: Fabrication of CuNi Thin Alloy Films

A house-designed aerosol-assisted chemical vapor deposition (AA-CVD) technique was employed to fabricate CuNi alloy coatings on SS304 specimens. The design and operation of the AA-CVD process with the deposition parameters are discussed in prior arts [See: *Muhammad Ali Ehsan; Abuzar Khan. Aerosol-assisted chemical vapor deposition growth of $NiMoO_4$ nanoflowers on nickel foam as effective electrocatalysts toward water oxidation. RSC Adv.* 2019, 9, 14899-14909. See: *Muhammad Ali Ehsan; Syed Shaheen Shah; Shaik Inayath Basha; Abbas Saeed Hakeem; Md Abdul Aziz. Recent advances in processing and applications of heterobimetallic oxide thin films by aerosol-assisted chemical vapor deposition. ACS Omega* 2021, 6, 31339-31347, incorporated herein by reference in its entirety]. The precursors of Cu $(acac)_2$ [100 milligram (mg), 382 millimole (mmol)] and Ni $(acac)_2$ (100 mg, 389 mmol) were dissolved in a mixture of methanol and chloroform (18 mL: 7 mL) with gentle stirring for 5 min. The resultant sea-green, transparent solution was transferred to a two-necked flask containing AA-CVD. The dual precursor solution was transformed into a mist-aerosol using an ultrasonic humidifier and transported to the tube furnace through the carrier gas (10% $H_2$ balanced with 90% $N_2$) at a flow speed of 100 cubic centimeter per milliliter ($cm^3$/mL). The SS304 specimen was preheated at 475° C. in a horizontal tube furnace with a quartz glass reactor tube. The SS304 specimen was placed in the tube furnace such that the nebula of precursor was straightaway passed the surface, in which the disintegration of the precursor and subsequent CVD process occurred to form the CuNi alloy coating. Based on the preliminary results obtained, the deposition rate beyond 3 hour (h) provided undesirable results (less adhesion strength/visible defects). Therefore, the investigation was limited to deposition times of up to 3 hours. The CVD processing procedure was obtained for definite time periods of 1 h, 2 h, and 3 h, and the obtained specimens were respectively termed as CuNi-1, CuNi-2, and CuNi-3. After finalizing the CVD processing, the aerosol supply was terminated, and the furnace was allowed to cool to room temperature under a carrier gas flow. The produced CuNi coatings had a metallic gray color and demonstrated excellent adhesion to the 304SS specimen, as verified by the scotch tape adhesion test.

Example 3: Structural Characterization

The scanning electron microscopic (SEM) examination was performed using the JEOL JSM-6610LV instrument to inspect the morphology of the CuNi alloy. The metallic composition of the coatings was determined using energy-dispersive X-ray spectrometry (EDS; *Oxford Instruments, INCA Energy* 200, UK, incorporated herein by reference in its entirety). The crystalline structure of the alloy coatings was verified with X-ray diffraction (XRD; *Rigaku MiniFlex X-ray diffractometer, Japan*, incorporated herein by reference in its entirety) over a 2θ range of 10°-90°. To analyze the chemical composition and valence states, X-ray photoelectron spectroscopy (XPS; *Thermo Scientific EscaLab* 250*Xi*, USA, incorporated herein by reference in its entirety) was used with an Al Kα (1486.6 eV) source. C1s [284.6 electron volt (eV)] was used as the standard to calibrate the electron beam.

Example 4: Corrosion Test of Coated Stainless-Steel (SS) Specimens Under Proton Exchange Membrane Fuel Cells (PEM-FC) Simulated Operating Environments The corrosion reactions suppressed by the CuNi coatings on the SS304 surface were thoroughly investigated using a Gamry potentiostat (3000 Reference model, USA, incorporated herein by reference in its entirety). This involved the arrangement of a graphite plate as the counter, a saturated calomel electrode (SCE) as the reference, and a CuNi-coated SS304 specimen (exposure area of 1 $cm^2$) as the working electrode, respectively. A 150 ml electrolytic solution containing sulphuric acid ($H_2SO_4$) [0.5 molar (M)]+hydrogen fluoride (HF) [2 parts per million (ppm)] was employed as the testing medium for all corrosion analyses. Pre-bubbling of $H_2$ gas and air was performed in the testing solution for approximately 1 h to create the PEM-FC anodic and cathodic operating conditions. Before the corrosion analyses, the open-circuit potential (OCP) was monitored for 1800 s, allowing the SS specimen to reach an electrochemical steady state in the tested medium. Potentiostatic polarization (PST) tests were performed on the coated specimens at −0.1 volts versus saturated calomel electrode (VSCE) (purged with $H_2$) and +0.6 VSCE (purged with air) in the testing solution to inspect the corrosion resistant performance in the anode and cathode PEM-FC conditions. Similarly, potentiodynamic polarization (PDP) was also performed by applying the polarizing potential of 0.250 V vs OCP to 1.00 V Vs SCE with the sweeping speed of 0.5 megavolt per second (mV/s) under the simulated environments. Electrochemical impedance spectroscopic (EIS) measurements were conducted using a frequency region ranging from 100 kilohertz (kHz) to 0.05 hertz (Hz), engaging a 10-mV amplitude perturbation.

Figure 2:
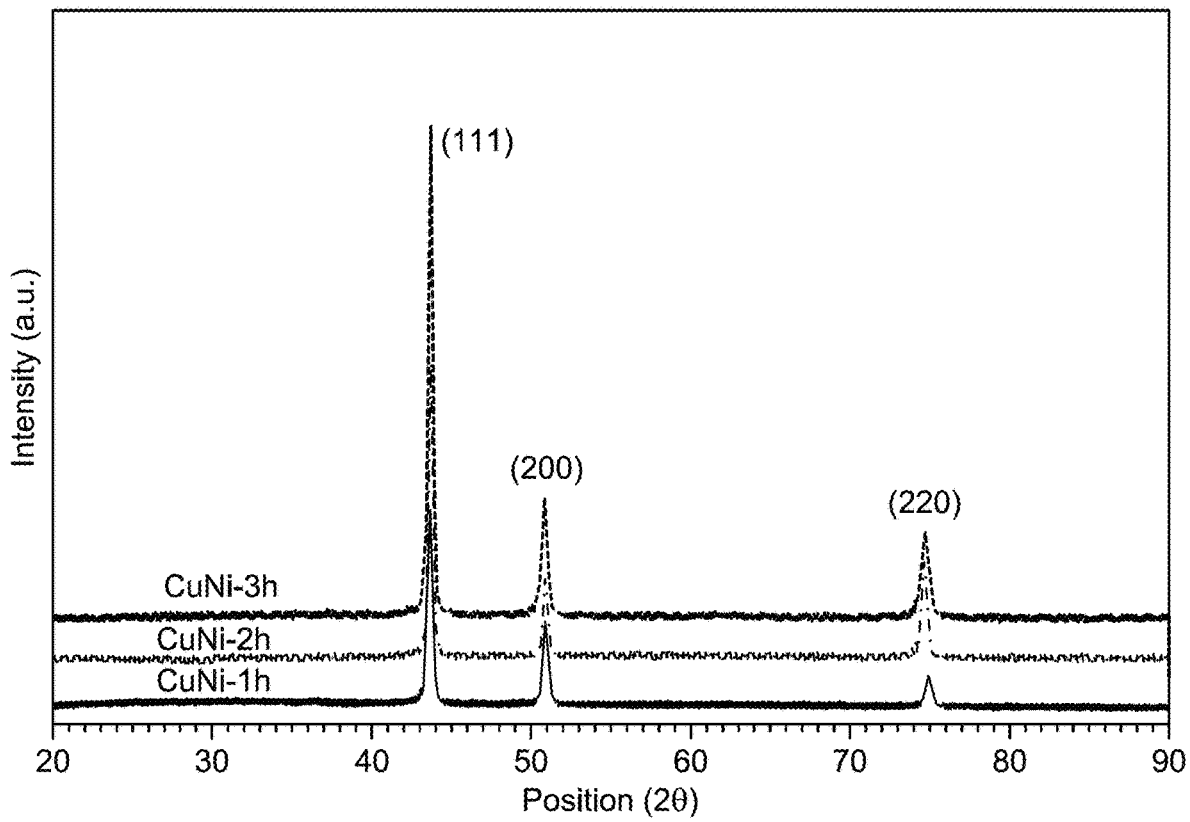
FIG. 2 depicts an X-ray diffraction (XRD) spectrum for the copper-nickel (CuNi) coatings developed for time periods of 1 h, 2 h and 3 h respectively via aerosol-assisted chemical vapor deposition (AA-CVD), according to certain embodiments.

The prepared CuNi alloy coatings for the different time periods of 1 h, 2 h, and 3 h were initially characterized by X-ray diffraction (XRD). The XRD patterns for each alloy coating sample are displayed in FIG. 2. Each XRD spectrum explicitly exhibits three crystalline peaks at 2θ=44°, 51.3°, and 75.5°, corresponding to the (111), (200), and (220) planes. The XRD data matched the standard powder diffraction file (PDF No: 01-071-7832) for the CuNi alloy crystallized in a cubic crystal system.

No extra crystalline peaks of any other metallic Ni or Cu and CuNi phase were detected, signifying the purity of the formed CuNi alloy films in all the deposition periods. The effect of the deposition time or sintering time may be further analyzed by relating to the peak height of the (220), which increases with increasing deposition time from 1 h to 3 h.

Figure 3A:
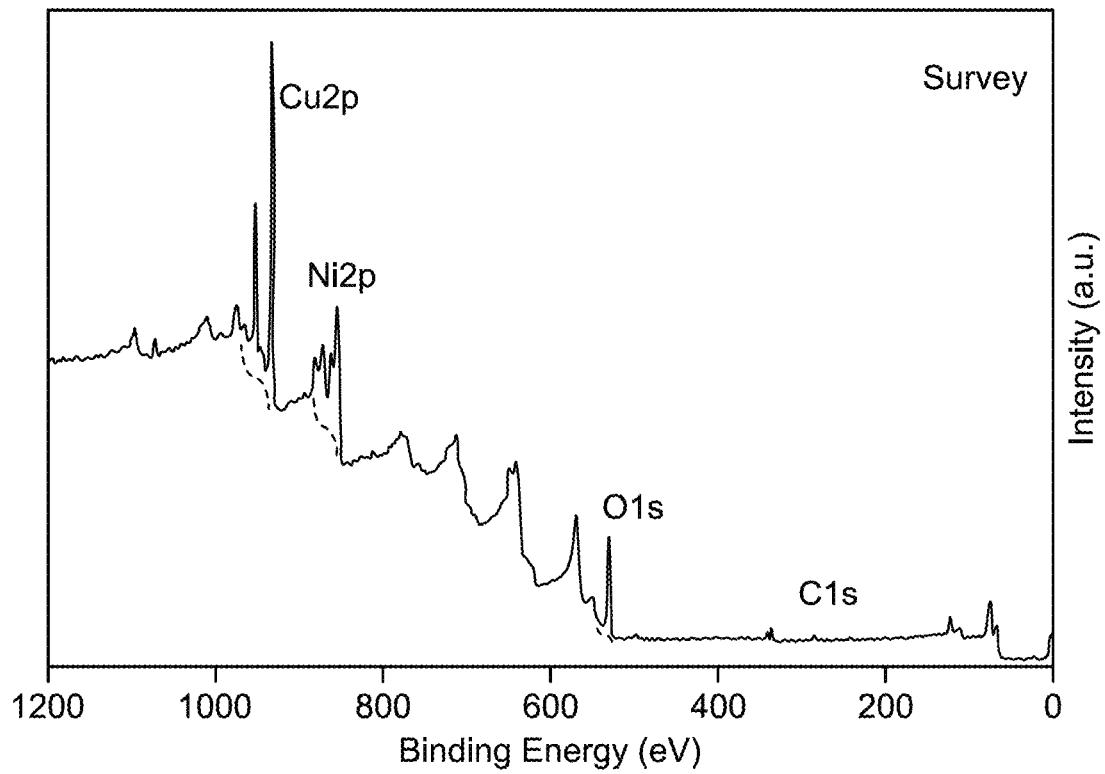
FIG. 3A depicts an X-ray photoelectron spectroscopy (XPS) result for the CuNi alloy sample processed for 2 h showing survey spectrum representing the existence of Cu, Ni, O, and C, according to certain embodiments.
Figure 3B:
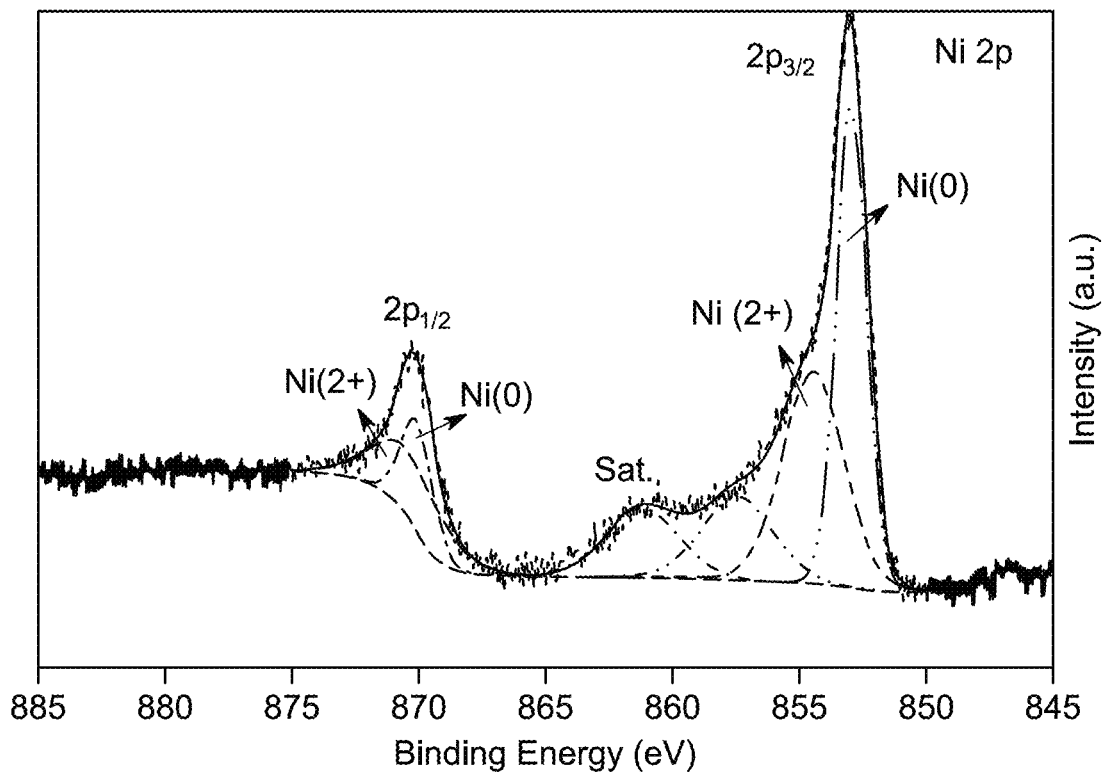
FIG. 3B depicts an XPS deconvoluted spectrum of nickel 2p orbital (Ni2p) in the CuNi alloy, according to certain embodiments.
Figure 3C:
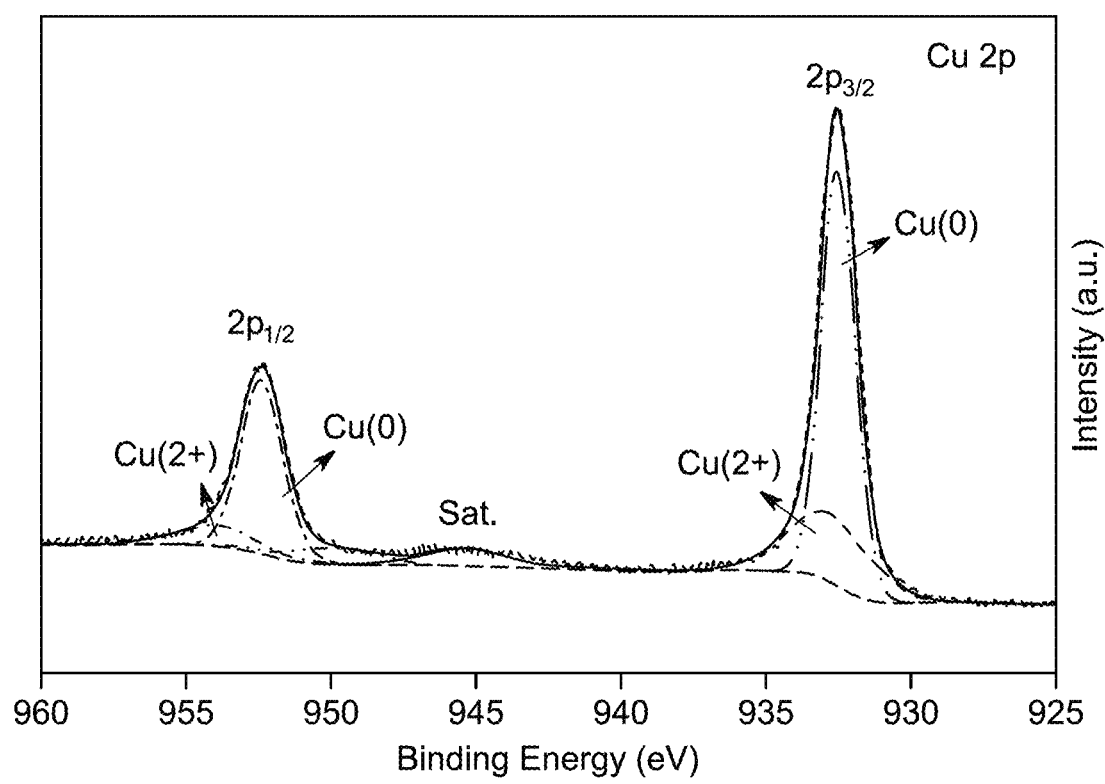
FIG. 3C depicts an XPS deconvoluted spectrum copper 2p orbital (Cu2p) in the CuNi alloy, according to certain embodiments.
Figure 4A:
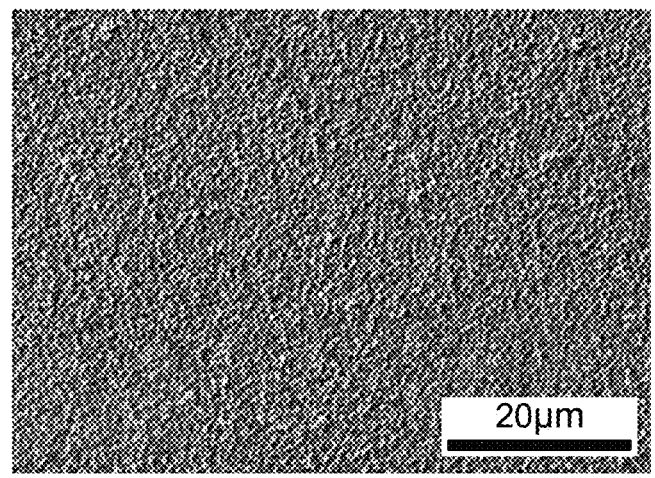
FIG. 4A depicts a low resolution field emission scanning electron microscope (FESEM) image of the CuNi alloy coating sample deposited for 1 h via AA-CVD at 20 micrometer ($\mu m$) magnification, according to certain embodiments.
Figure 4B:
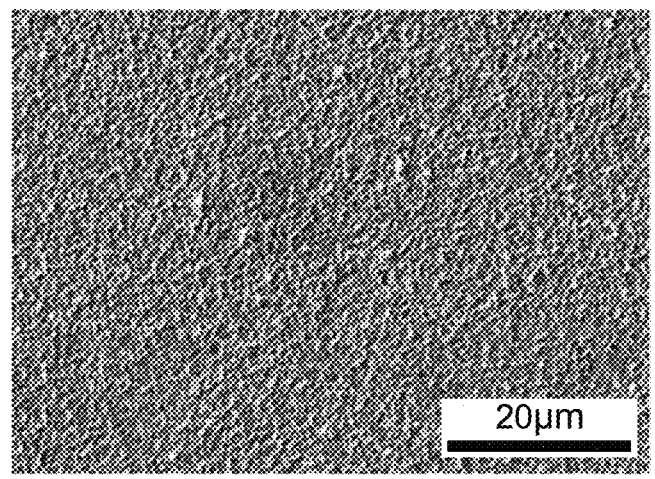
FIG. 4B depicts a low resolution FESEM image of the CuNi alloy coating sample deposited for 2 h via AA-CVD at 20 $\mu m$ magnification, according to certain embodiments.
Figure 4C:
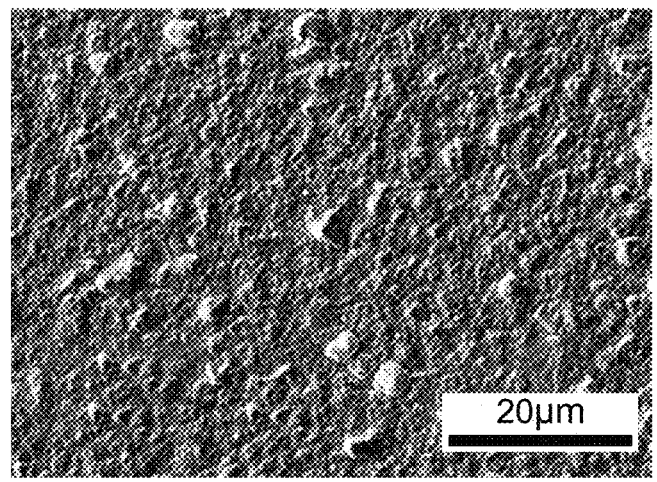
FIG. 4C depicts a low resolution FESEM image of the CuNi alloy coating sample deposited for 3 h via AA-CVD at 20 $\mu m$ magnification, according to certain embodiments.
Figure 4D:
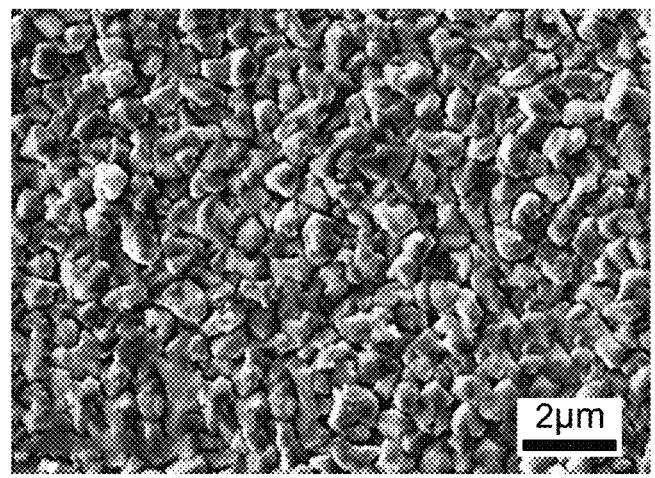
FIG. 4D depicts a high-resolution morphological scanning electron microscope (SEM) image of the CuNi alloy coating sample deposited for 1 h via AA-CVD at 2 $\mu m$ magnification, according to certain embodiments.
Figure 4E:
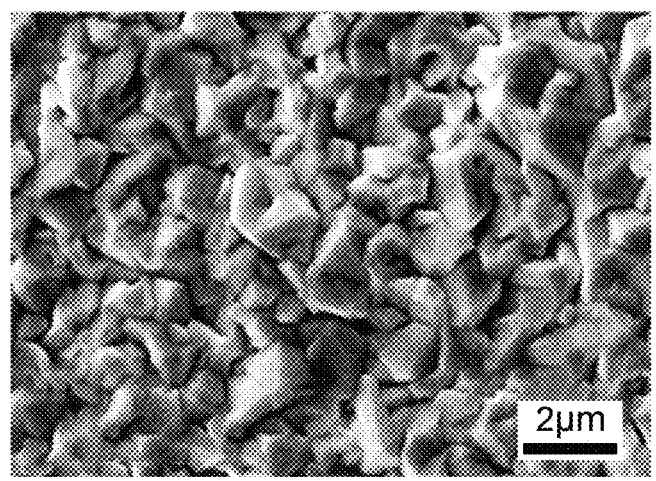
FIG. 4E depicts a high-resolution morphological SEM image of the CuNi alloy coating sample deposited for 2 h via AA-CVD at 2 $\mu m$ magnification, according to certain embodiments.
Figure 4F:
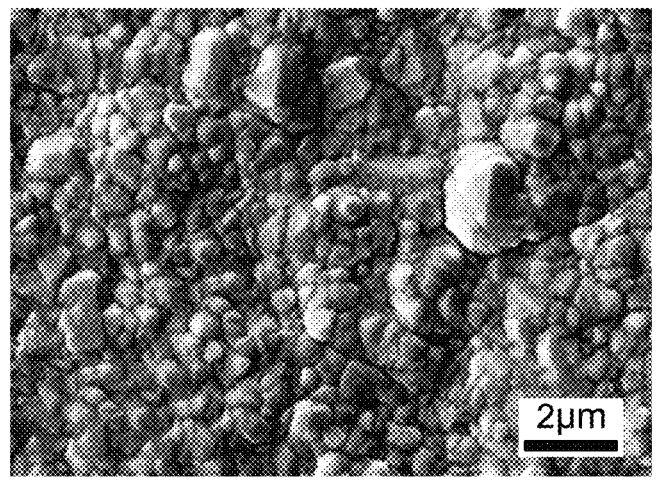
FIG. 4F depicts a high-resolution morphological SEM image of the CuNi alloy coating sample deposited for 3 h via AA-CVD at 2 $\mu m$ magnification, according to certain embodiments.
Figure 4G:
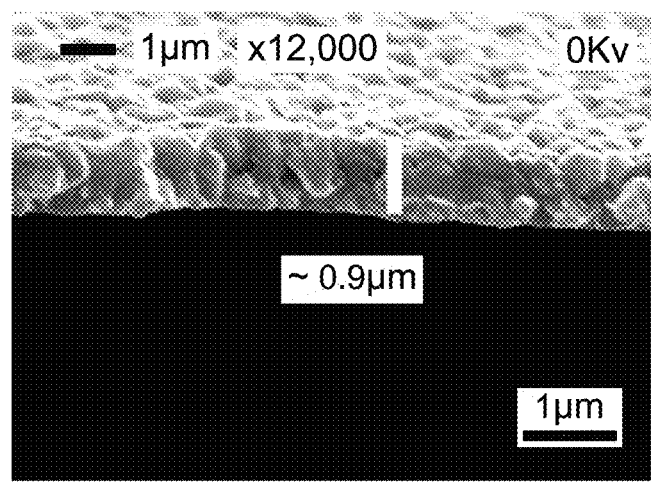
FIG. 4G depicts a SEM cross-sectional image of the CuNi alloy coating sample deposited for 1 h via AA-CVD, according to certain embodiments.
Figure 4H:
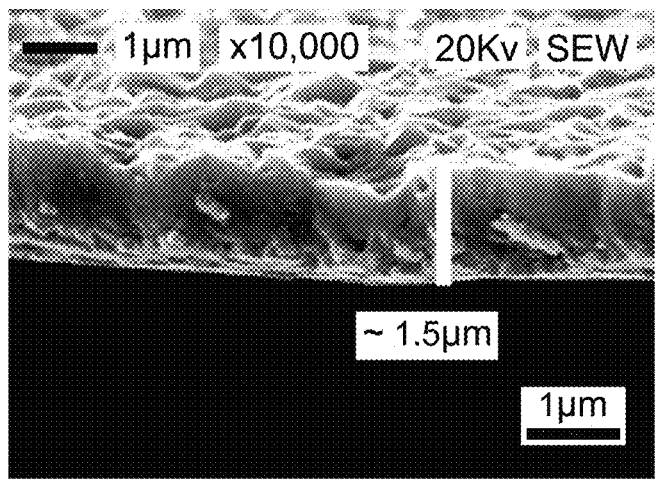
FIG. 4H depicts a SEM cross-sectional image of the CuNi alloy coating sample deposited for 2 h via AA-CVD, according to certain embodiments.
Figure 4I:
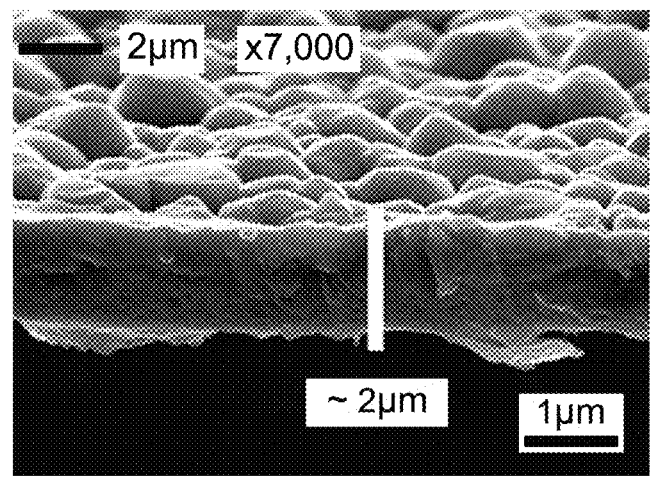
FIG. 4I depicts a SEM cross-sectional image of the CuNi alloy coating sample deposited for 3 h via AA-CVD, according to certain embodiments.

Further, the CuNi alloy sample grown for 2 h was investigated by X-ray photoelectron spectroscopy (XPS) analysis to determine the chemical states of the primary constituents. The XPS survey spectrum demonstrated the existence of Ni, Cu, O, and C on the surface of sample CuNi alloy, as shown in FIG. 3A. FIG. 3B shows the high-resolution deconvoluted spectrum of Ni 2p in the CuNi alloy. The XPS signals appeared at 852.93 and 870.18 eV were assigned to Ni $2p_{3/2}$ and Ni $2p_{1/2}$ of metallic Ni in the zero (0) oxidation state. The observed peaks at binding energies of 854.38 eV and 870.83 eV were attributed to the Ni $2p_{3/2}$ and Ni $2p_{1/2}$ of $Ni^{2+}$ ions, which suggest the surface oxidation of the alloy coating when exposed to the air [See: Chengqi Wu; Jie Zhu; Hu Wang; Guojing Wang; Tao Chen; Yiwei Tan. Porous Ni1-xCuxO Nanowire arrays as noble-metal-free high-performance catalysts for ammonia-borane electrooxidation ACS Catalysis 2020, 10, 721-735 and Hong-Yan Chen; Hua-Jie Niu; Xiaohong Ma; Jiu-Ju Feng; Xuexiang Weng; Hong Huang; Ai-Jun Wang. Flower-like platinum-cobalt-ruthenium alloy nano assemblies as robust and highly efficient electrocatalyst for hydrogen evolution reaction J. Coll. Inter. Sci. 2020, 561, 372-378, incorporated herein by reference in its entirety]. In addition, 861.33 eV and 877.38 eV are the characteristic satellite peaks of Ni [See: Muhammad Ali Ehsan; Abdul Rehman; Adeel Afzal; Asghar Ali; Abbas Saeed Hakeem; Usman Ali Akbar; Naseer Iqbal. Highly effective electrochemical water oxidation by millerite-phased nickel sulfide nanoflakes fabricated on Ni foam by aerosol-assisted chemical vapor deposition Energy Fuels 2021, 35, 16054-16064, incorporated herein by reference in its entirety]. Analogously, the XPS spectrum of the Cu 2pp involves two fitted bands at 932.23 eV and 952.08 eV, which correspond to the Cu $2p_{3/2}$ and Cu2 $p_{1/2}$ of metallic Cu (0), as shown in FIG. 3C. The obtained peaks at 933.08 eV and 953.58 eV were assigned to the Cu $2p_{3/2}$ and Cu $2p_{1/2}$ of $Cu^{2+}$, whereas 945.28 eV represented a satellite peak [See: Chengqi Wu; Jie Zhu; Hu Wang; Guojing Wang; Tao Chen; Yiwei Tan. Porous Ni1-xCuxO Nanowire arrays as noble-metal-free high-performance catalysts for ammonia-borane electrooxidation ACS Catalysis 2020, 10, 721-735 and Yi Ren; Yujia Bai; Genxiang Wang; Yijian Liu; Chuancheng Mou; Jiayu Chen; Baohuan Wei; Hui Wang; Yuhan Sun. CuNiAlloy nanoparticles anchored on nitrogen-doped carbon nanotubes for efficient $CO_2$ electroreduction to CO Energy Fuels 2023, 37, 9289-9296, incorporated herein by reference in its entirety].

The surface morphologies and cross-sectional structures of the CuNi alloy coatings were inspected by SEM observations, as shown in FIG. 4. The low-resolution SEM images illustrate the substantial growth of the alloy material, covering a large substrate area in all three fabricated samples, as shown in FIG. 4A-4C. Detailed insights into the coating characteristics and texture are observed in the high-resolution field emission scanning electron microscope (FE-SEM) images, as shown in FIG. 4D-4F. During the first hour of deposition, the CuNi granules were clearly discernible and gradually diffused as the sintering time was increased to 2 h, as shown in FIG. 4D. This interdiffusion process led to the reduction of the grain boundaries among the particles, resulting in a solid rock-like structure, as shown in FIG. 4E. The third CuNi coating sample was directly deposited after 3 h of sintering, and a solid and compact microstructure was obtained, indicating the completion of the diffusion process. The impact of sintering becomes more apparent in the cross-section of the CuNi coatings, where the layers progressively acquire a compact and dense structure as the sintering period increases from 1 h to 3 h, as shown in FIG. 4G-4I, Simultaneously, the thickness of the CuNi layer varies from approximately 0.9 μm to 2 μm during the growth period of 1 h to 3 h.

Figure 5A:
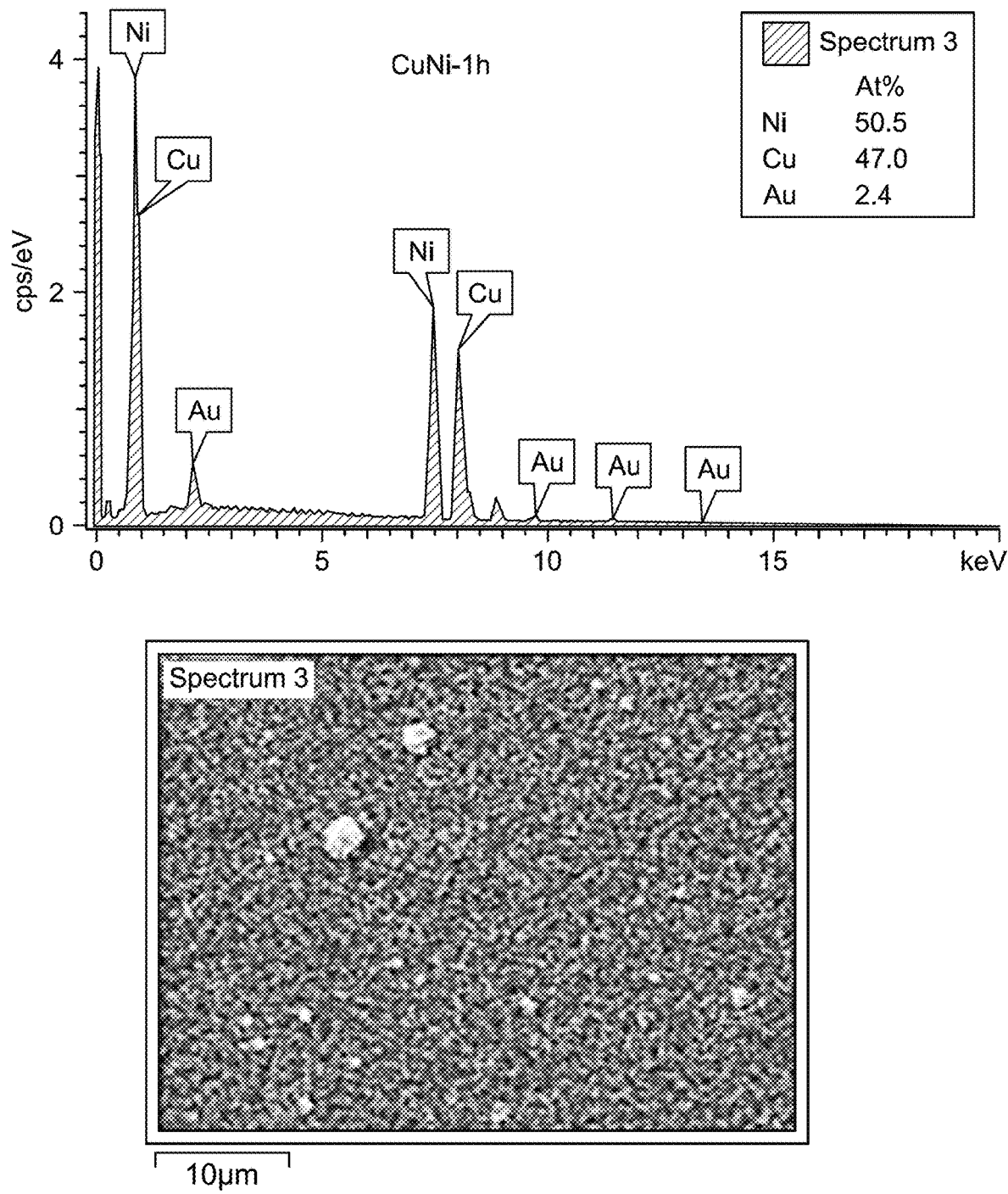
FIG. 5A depicts an energy dispersive x-ray spectroscopy (EDS) pattern of CuNi alloy coatings grown after increasing the deposition period to 1 h via AA-CVD, according to certain embodiments.
Figure 5B:
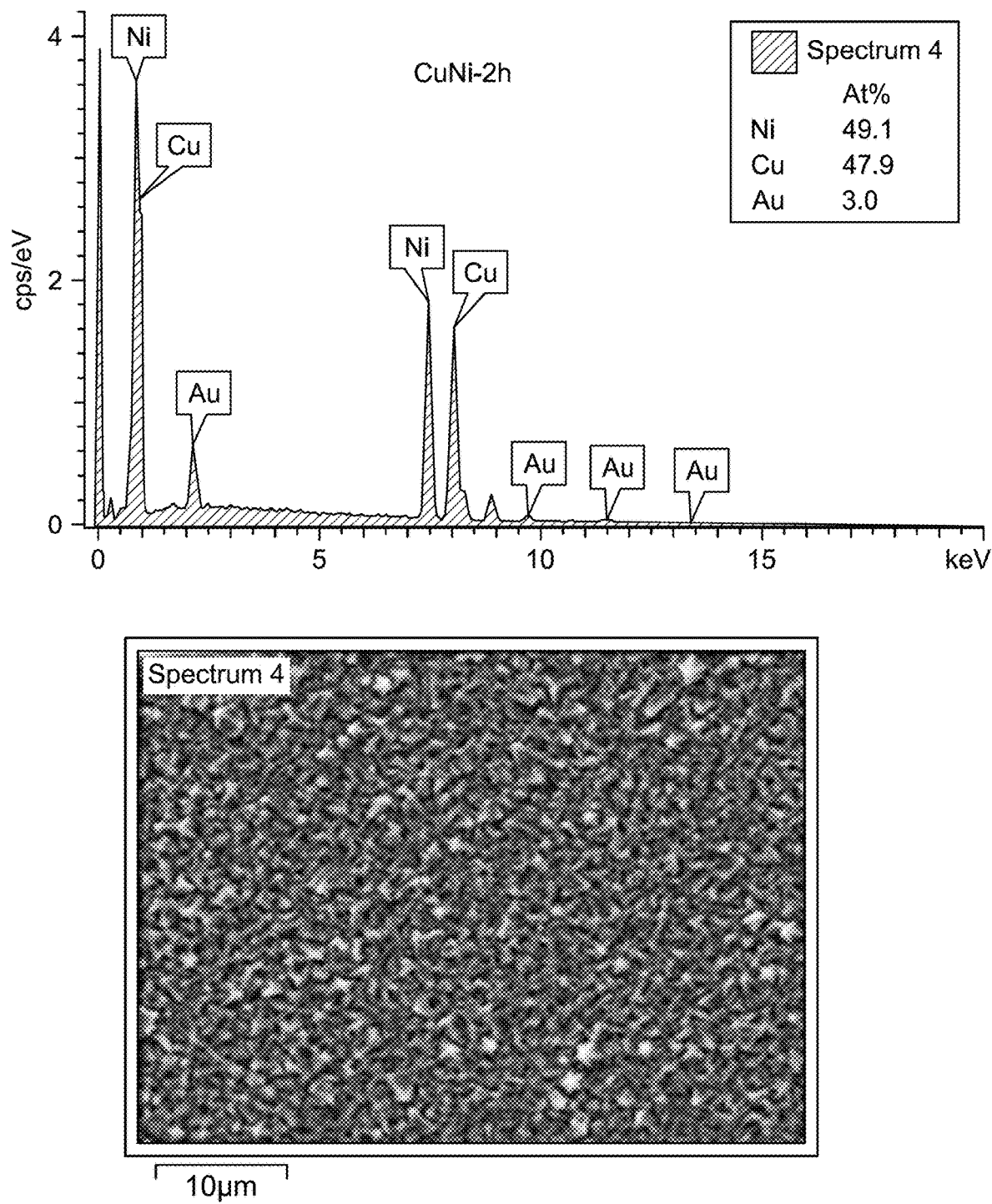
FIG. 5B depicts an EDS pattern of CuNi alloy coatings grown after increasing the deposition period to 2 h via AA-CVD, according to certain embodiments.
Figure 5C:
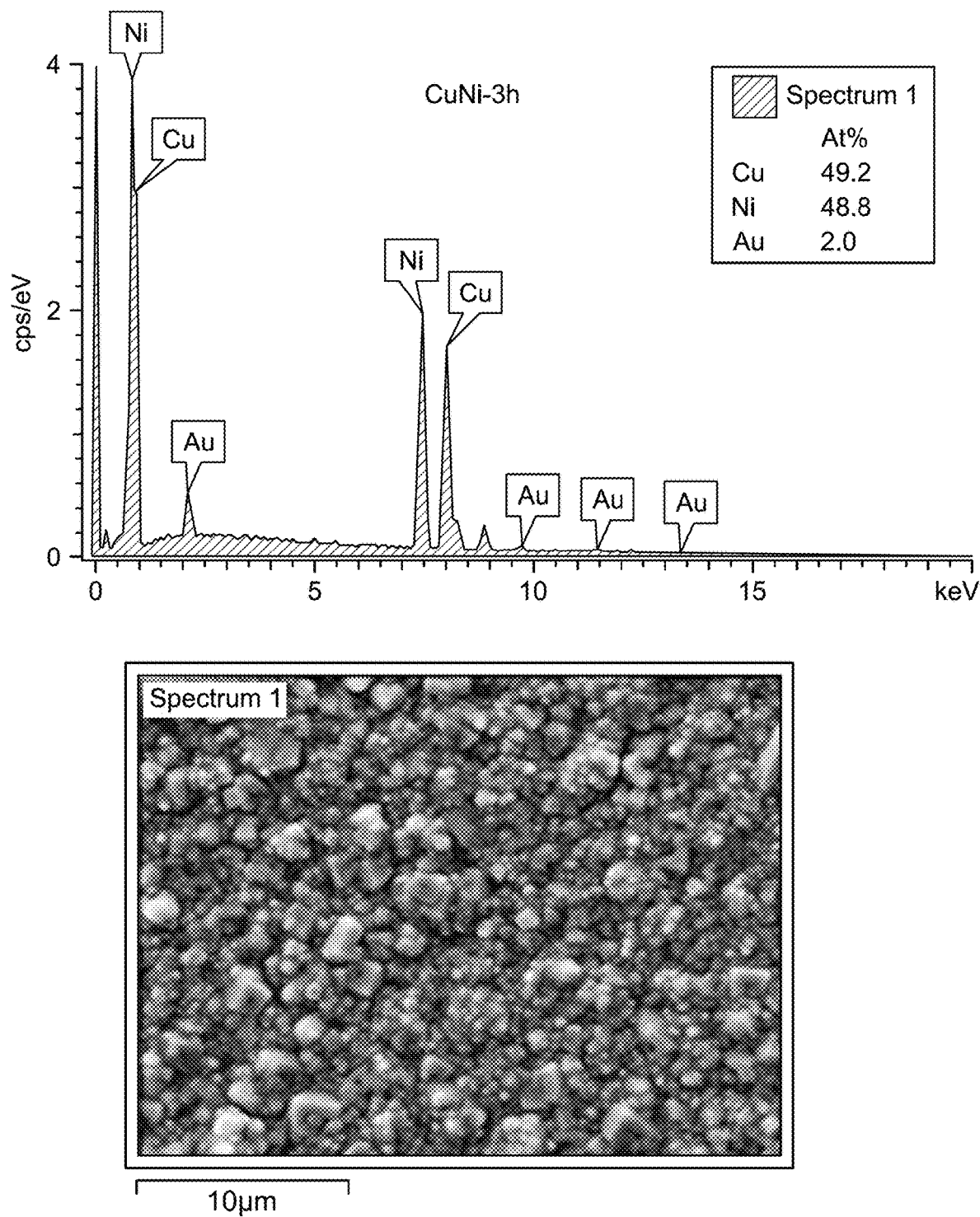
FIG. 5C depicts an EDS pattern of CuNi alloy coatings grown after increasing the deposition period to 3 h via AA-CVD, according to certain embodiments.
Figure 6A:
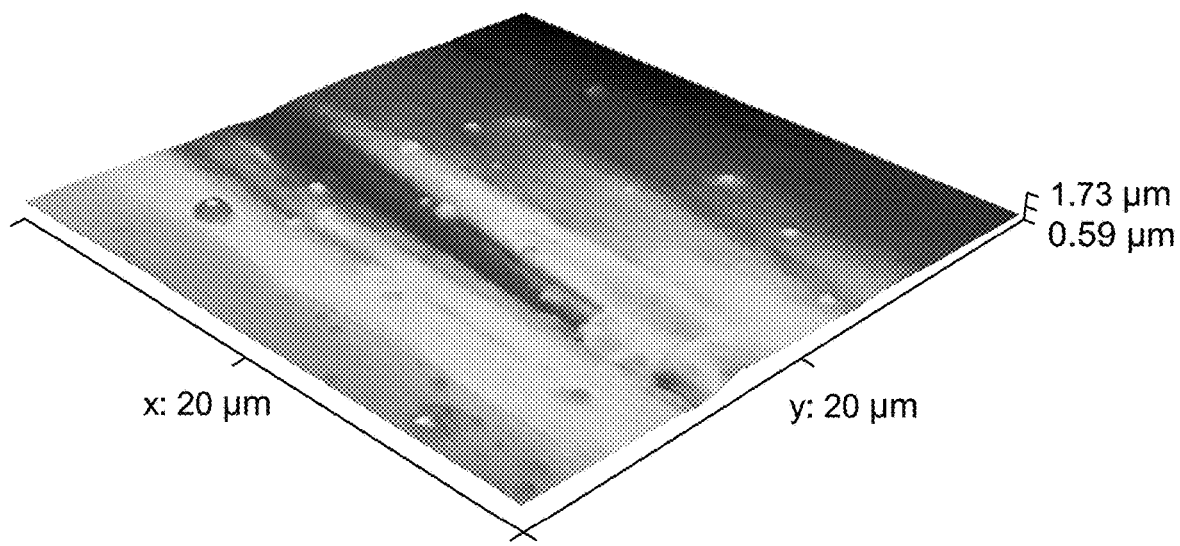
FIG. 6A depicts an atomic force microscopic (AFM) image of bare SS304 specimen, according to certain embodiments.
Figure 6B:
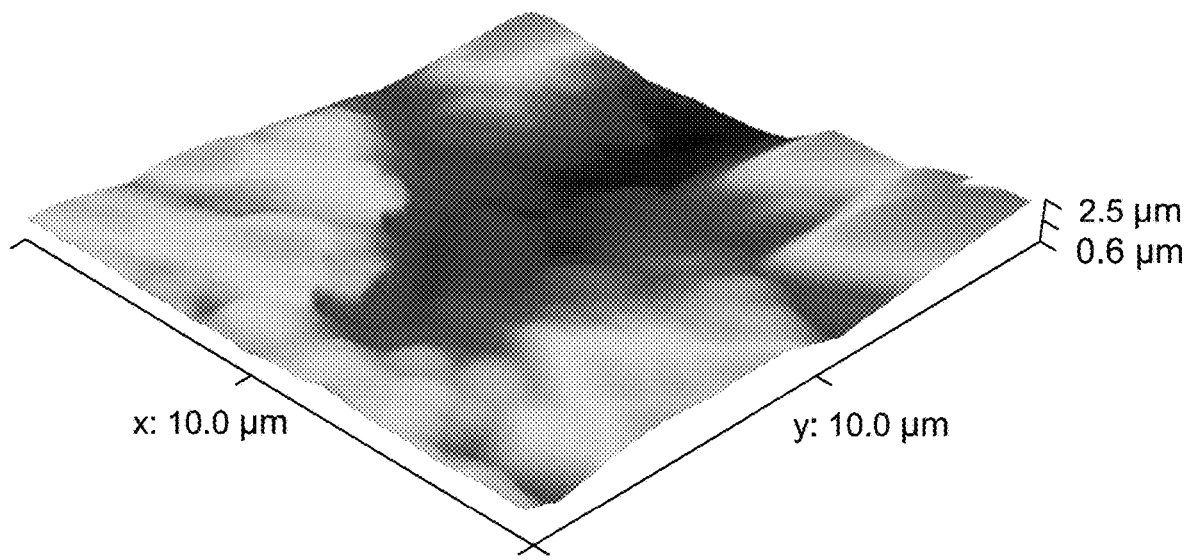
FIG. 6B depicts an AFM image of CuNi-1 h coated SS304 specimens, according to certain embodiments.
Figure 6C:
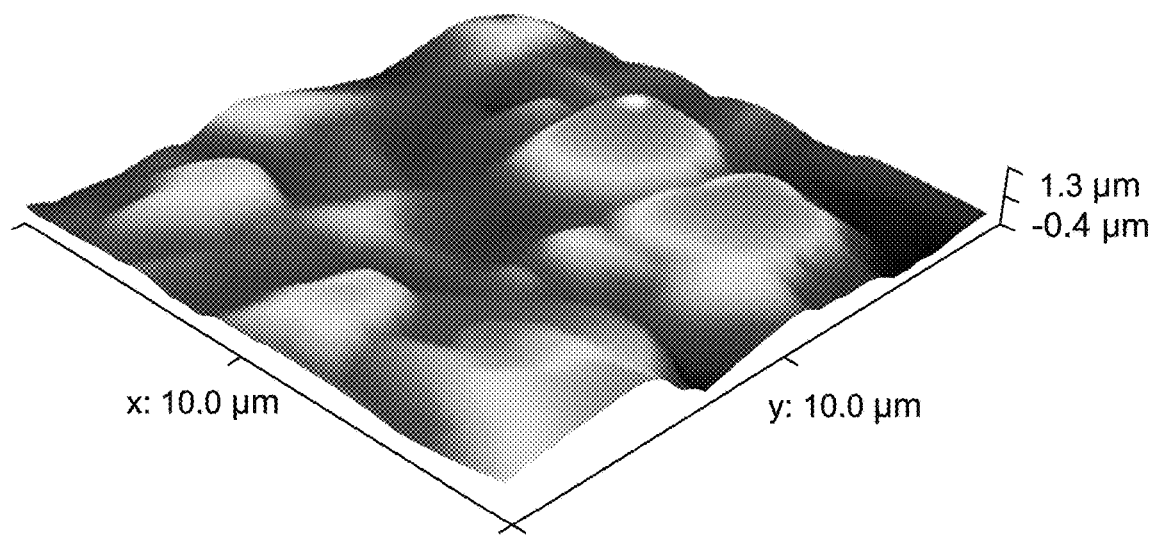
FIG. 6C depicts an AFM image of CuNi-2 h coated SS304 specimens, according to certain embodiments.
Figure 6D:
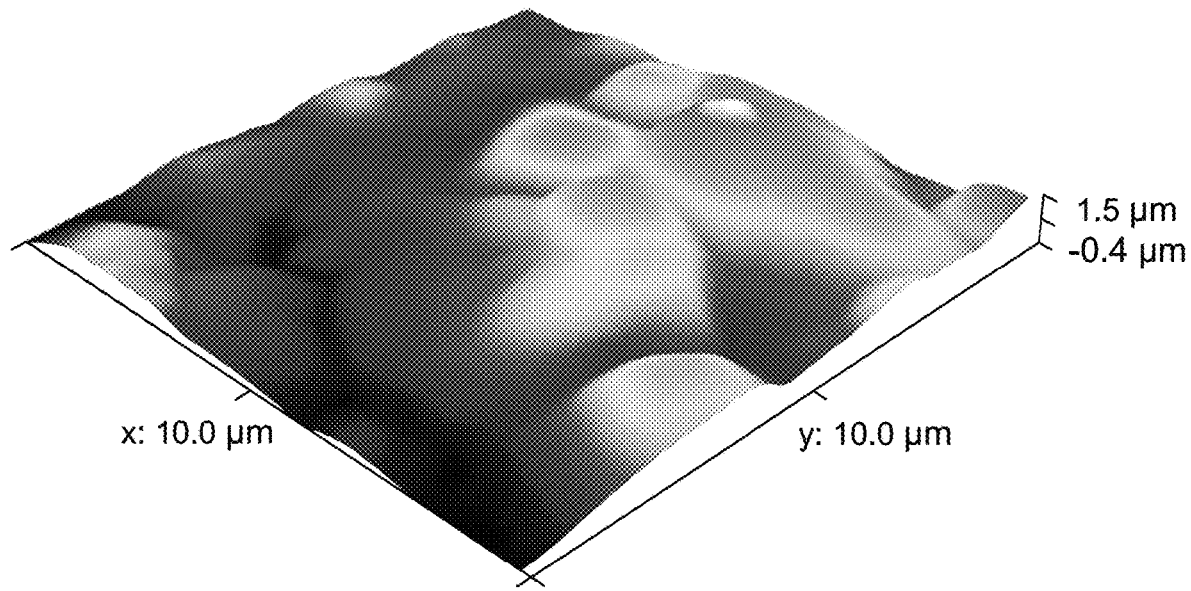
FIG. 6D depicts an AFM image of CuNi-3 h coated SS304 specimens, according to certain embodiments.

The chemical composition of the CuNi alloy coating was determined by energy dispersive X-ray spectroscopy (EDS) investigation. In FIG. 5A-5C, the EDS spectra and percentage atomic composition of the essential Cu and Ni in each alloy catalyst are presented. The CuNi-1 h sample comprised 47% Cu and 50.7% Ni, while the CuNi-2 h sample contained 47.9% Cu and 49.1% Ni. In comparison, the CuNi-3 h sample contained Cu at 49.2% and Ni at 48.8%. Overall, the empirical metallic ratio between Cu and Ni in all three alloy samples remained close to 1:1, which is consistent with the chemical formula of CuNi observed in the XRD results. In the EDS spectra, the elemental peak of aurum (Au) corresponds to the Au coating, which was used to minimize the charging effect during the recording of the SEM images. Moreover, no oxygen (O) is detected in the EDS spectra, signifying the deposition of pure bimetallic alloys in all three cases.

The surface textures of the bare and CuNi-coated specimens were studied to explore the effect of the deposition time on the surface topography and roughness of processed chemical vapor deposition (CVD) films. The obtained atomic force microscopy (AFM) 3D images are shown in FIG. 6A-6D, where the bare 304 SS specimen shows a planar surface with a one-directional trench gained from mechanical polishing. The AFM images of the coated specimens revealed that the micro spherical structures grew as the deposition time increased. Surface roughness is characteristically assessed using suitable parameters, including the $R_a$ (the average value of profile deviation from the mean line), $R_q$ (the root-mean-square deviation of a profile), $R_v$ (the maximum valley depth), $R_p$ (maximum peak height), and $R_z$ (the average peak to valley height). Table 1 presents the numerical values of the surface roughness parameters for the investigated coated samples. In general, $R_a$ and $R_q$ are the two most significant characteristics for depicting the surface profile as they illustrate how the surface varied from a homogeneous surface.

After the deposition of CVD films, $R_a$ value observed by AFM rises from 0.008 μm to 0.030 μm as the deposition period increases from 1 h to 3 h, particularly, the CuNi-1 hr sample exhibited the lowest $R_q$ values and increased to almost 4 μm with the deposition rate, as shown in Table 1.

TABLE 1

Surface roughness parameters of bare and CuNi coated specimens

| Substrate | $R_a$ (μm) | $R_q$ (μm) | $R_p$ (μm) | $R_v$ (μm) | $R_z$ (μm) |
|---|---|---|---|---|---|
| Bare | 0.0089 | 0.9851 | 1.7856 | 0.3471 | 1.2547 |
| CuNi-1 h | 0.0112 | 1.8652 | 2.1254 | 0.2135 | 1.5952 |
| CuNi-2 h | 0.0184 | 2.9321 | 1.3547 | 0.2456 | 2.5384 |
| CuNi-3 h | 0.0306 | 4.1256 | 1.5849 | 0.2578 | 2.9654 |

This increase may be accompanied by an interdiffusion process, which expands the grain boundaries and forms an island-like topographic structure, as observed in the SEM analysis. To determine the values of $R_z$, the five highest and deepest peaks on a straight surface profile are generally selected. Thus, observing $R_z$ represents the surface irregularities and heterogeneity of the film surface. The achieved values revealed that the CuNi-1 hr sample exhibited the lowest $R_z$ value, suggesting the highest surface homogeneity. Moreover, $R_v$ evaluates the presence of microdefects such as cracks and pits, while $R_p$ illustrates the contamination on the film surfaces. From Table 1, the values of $R_v$ are steadily lower than the $R_p$ values for all coated samples, signifying that the investigated film surfaces are free from the pits, pores or cracks. Both SEM and AFM results confirmed that extending the deposition time resulted in CuNi films with rougher surfaces.

Figure 7A:
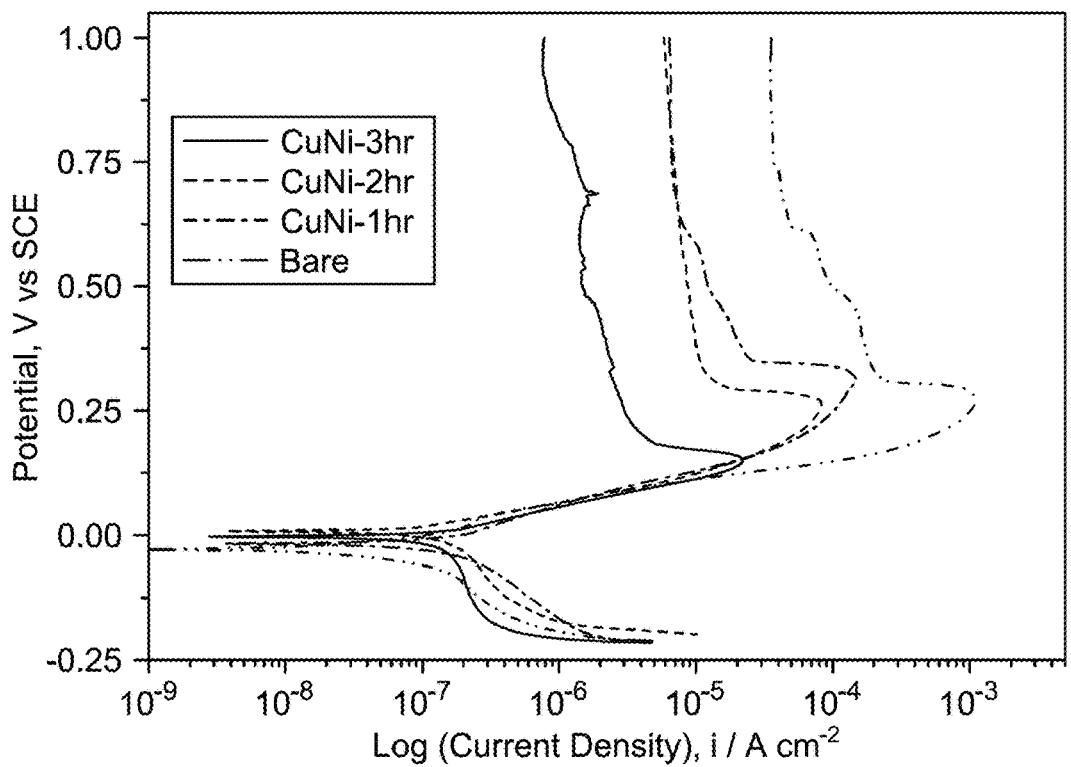
FIG. 7A depicts potentiodynamic polarization (PDP) plots of the CuNi-coated SS specimens in an anode simulated fuel cell environments, according to certain embodiments.
Figure 7B:
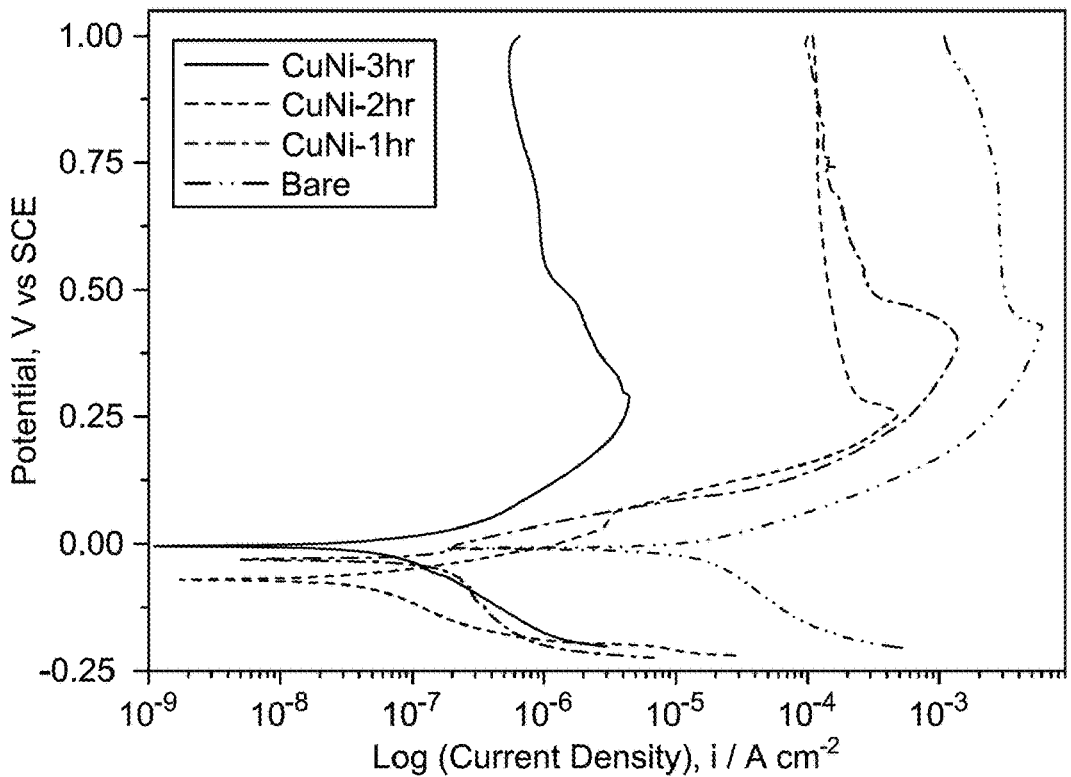
FIG. 7B depicts PDP plots of the CuNi-coated SS specimens in a cathode simulated fuel cell environments, according to certain embodiments.

FIG. 7 presents the potentiodynamic polarization (PDP) plots for the bare and CuNi-coated SS specimens in the simulated FC environments. The corrosion current density ($i_{corr}$), corrosion potential ($E_{corr}$), and passive current density ($i_{pass}$) computed from the PDP graphs are presented in Table 2. In the thermodynamics of corrosion, $E_{corr}$ denotes the struggle of corrosion, and $i_{corr}$ is the outcome produced by the corrosion process [See: Madhan Kumar, A; Abuzar Khan; Hussein, M. A.; Mohd. Yusuf Khan; Hatim Dafalla; Bharathi Suresh; Suresh Ramakrishna. Hybrid nanocomposite coatings from PEDOT and BN-TiO₂ nanosheets: Enhanced invitro corrosion resistance, wettability and bio compatibility for biomedical applications Prog. Org. Coat. 2022, 170, 106946, incorporated herein by reference in its entirety]. A higher $E_{corr}$ and smaller $i_{corr}$ generally exhibit better corrosion resistance characteristics [See: Madhan Kumar, A.; Mohd. Yusuf Khan; Abuzar Khan; Hussein, M. A.; Hatim Dafalla; Su Hwa Jang; Suresh Ramakrishna. Novel polymer nanocomposite based on polypyrrole and ZrO₂ reinforced BN nanosheets: Prospective utilization as implant coatings for TiNbZr bio-implant alloy Mater. Chem. Phy. 2022, 287, 126205, incorporated herein by reference in its entirety]. A shift in $E_{corr}$ in the more positive direction signifies a higher electrode potential. The $E_{corr}$ of the Cu—Ni-coated specimens shifted noticeably in the positive direction under both PEM-FC conditions. The protection effectiveness of the developed CuNi coating improved performance, with lower $i_{corr}$ and higher $E_{corr}$ values than those of bare SS304.

TABLE 2

PDP values of the bare and CuNi-coated specimens in the simulated fuel cell environments

| | Anode | | | Cathode | | |
|---|---|---|---|---|---|---|
| Substrate | $E_{corr}$, V | $I_{corr}$, μA cm⁻² | $I_p$, μA cm⁻² | $E_{corr}$, V | $I_{corr}$, μA cm⁻² | $I_p$, μA cm⁻² |
| Bare | −0.028 | 0.256 | 44.52 | −0.018 | 42.025 | 2730 |
| CuNi-1 h | −0.016 | 0.185 | 11.84 | −0.006 | 0.852 | 198.24 |
| CuNi-2 h | −0.012 | 0.168 | 7.21 | −0.032 | 0.294 | 129.84 |
| CuNi-3 h | −0.014 | 0.147 | 1.25 | −0.005 | 0.125 | 22.02 |

As shown, the CuNi coating significantly enhanced the corrosion properties of bare SS304, and all CuNi-coated SS specimens exhibited lower current densities and a more stable state. A positive shift in $E_{corr}$ was observed with extended deposition times, which is ascribed to the densification of the CuNi coatings. The obtained data showed a noteworthy decrease in the $i_{corr}$ of the coated SS304 under both anode and cathode conditions, possibly because of the growth of a compact and durable CuNi layer. The penetration of aggressive ions such as $F^-$ and $SO_4^{2-}$ is much more controlled by the passivation layer of the coated SS304 than by the bare SS304's passive film [See: Pugal Mani, S.; Rajendran N. Corrosion and interfacial contact resistance behavior of electrochemically nitrided 316L SS bipolar plates for proton exchange membrane fuel cells Energy 2017, 133, 1050-1062, incorporated herein by reference in its entirety]. In particular, the CuNi-3 h coating demonstrated the lowest current density (0.125 μA cm²), that is one order of magnitude lower than that of SS304 (42.025 μA cm²), indicating the minimal corrosion of the CuNi-3 h-coated sample compared to other specimens.

The lower values of $i_{pass}$ for the coated 304SS in harsh operating PEM-FC conditions revealed the electrochemical stability of the passivation film produced on the coated SS304 [See: Akeem Adesina, Y.; Drmosh, Q. A.; Madhan Kumar, A.; Amar Mohamedkhair, K. Post-annealing effect on the electrochemical behavior of nanostructured magnetron sputtered $W_3O$ films in chloride- and acid-containing environments Surf. Coat. Technol. 2021, 420, 127334, incorporated herein by reference in its entirety], even when the PEM-FC conditions were changed from anodic to cathodic. This indicates that it is a viable coating component for PEM-FC applications.

Figure 8A:
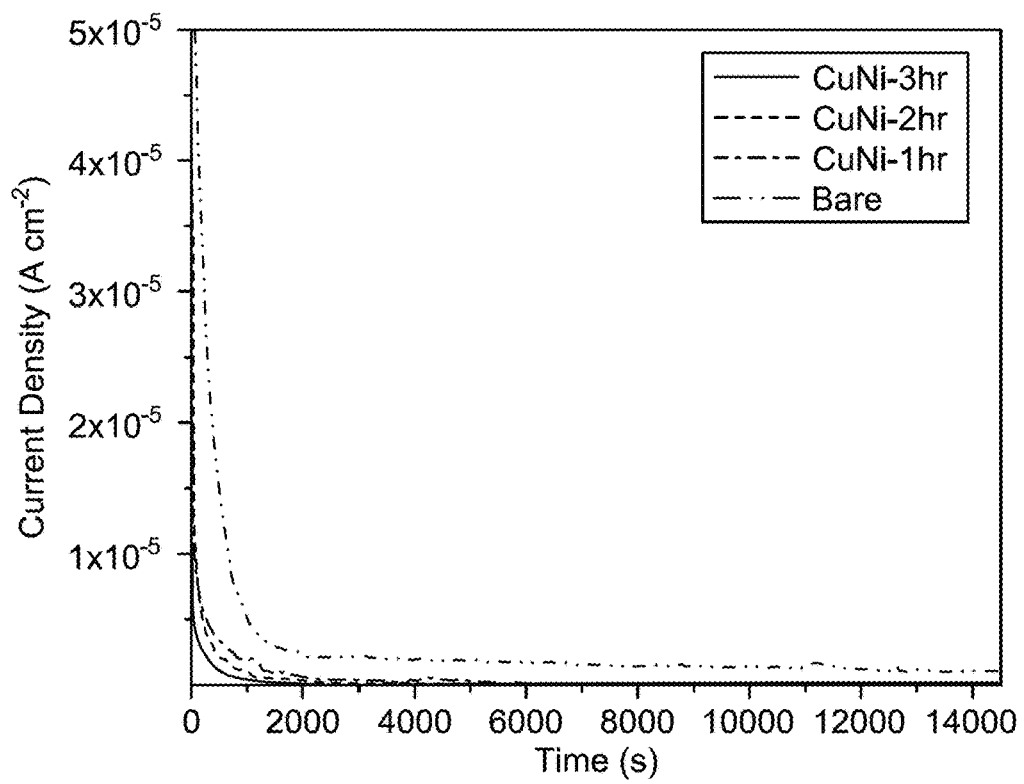
FIG. 8A depicts potensiostatic polarization test (PST) curves of the CuNi-coated specimens in an anode simulated fuel cell environments, according to certain embodiments.
Figure 8B:
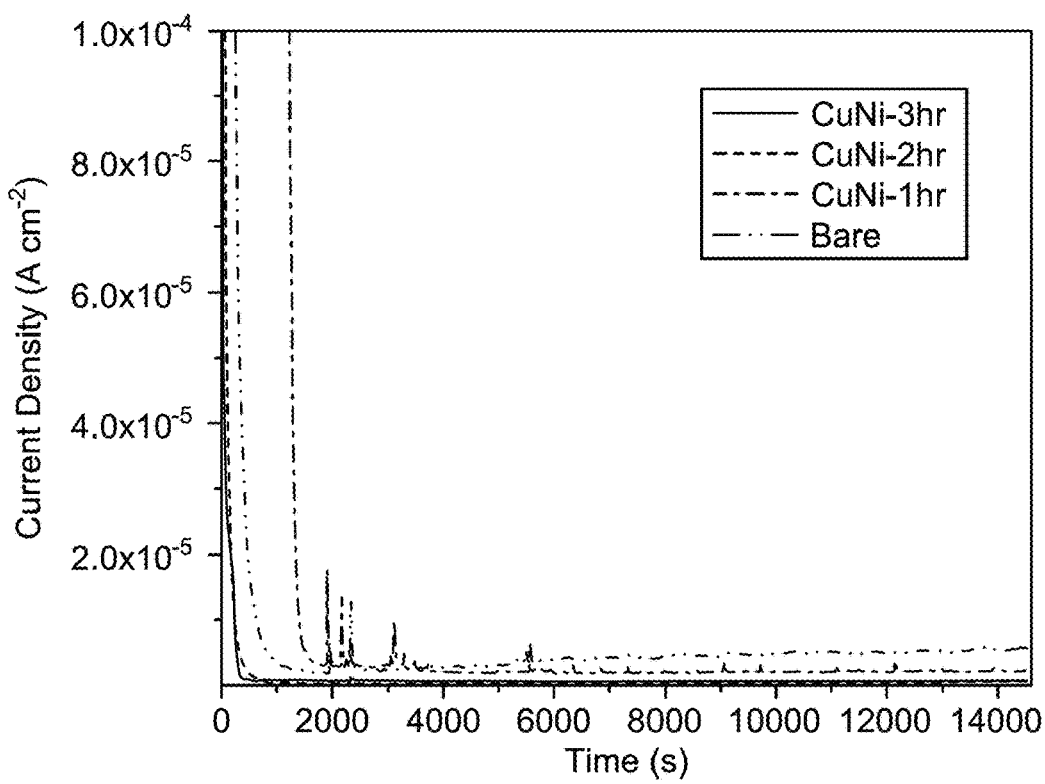
FIG. 8B depicts PST curves of the CuNi-coated specimens in a cathode simulated fuel cell environments, according to certain embodiments.

The obtained Potentiostatic polarization test (PST) curves are shown in FIG. 8. A steep decline in the current density at −0.1 V was observed by stabilization at 2.856 μA/cm² for bare SS304 and 0.840 μA/cm²-0.015 μA/cm² for coated SS. The observed PST plots prove that the SS specimens were readily passivated by the impact of the operating circumstances on the anodic potential. The steady and lowest current density values for all the coated specimens corroborated the effective passivation, resulting in minor corrosion under the PEM-FC anodic conditions [See: Jin Jin Ma; Jiang Xu; Shuyun Jiang; Paul Munroe; Zong-Han Xie. Effects of pH value and temperature on the corrosion behavior of a $Ta_2N$ nanoceramic coating in simulated polymer electrolyte membrane fuel cell environment Internat. 2016, 42, 16833-16851, incorporated herein by reference in its entirety]. In a cathodic environment, high current densities were respectively observed in the steadying region of 6.894 μA/cm² and 2.56 μA/cm²-0.58 μA/cm² for the uncoated and coated SS304 specimens. The coated SS304 specimens satisfied the DOE's compulsory $i_{corr}$ values for BPs in the range of <1 μA/cm² in both PEM-FC anodic and cathodic environments [See: Antunes, R. A.; Oliveira, M. C. L.; Ett, G. Corrosion of metal bipolar plates for PEM fuel cells Int. J. Hydrogen Energy 2010, 35, 3632-3647, incorporated herein by reference in its entirety]. Compared to the values observed for the anodic potential, the current density slightly increased in the cathode environment. The observed data indicates less passivation and substantial dissolution of the passive layer owing to the PEM-FC cathodic operating potential. The one-order magnitude reduction in current density for the coated SS304 in the cathodic environment clearly implies that the passivation layer produced on the coated SS304 was more electrochemically stable than that of the passive film of bare SS304. Hence, compared to the bare SS, the corrosion resistance performance of the coated SS304 specimens appeared to be high in the PEM-FC simulated operating environment.

Figure 9A:
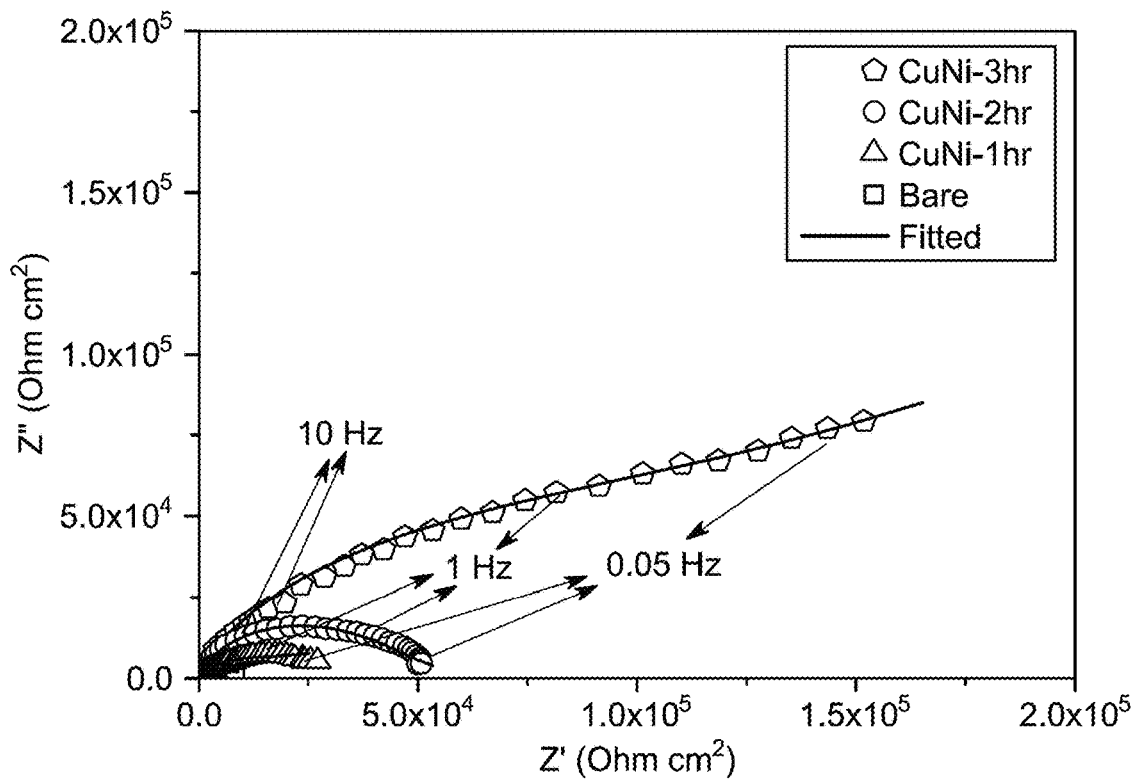
FIG. 9A depicts Nyquist plots of open-circuit potential (OCP) for the CuNi alloy-coated SS specimens in an open-circuit potential (OCP) proton exchange membrane fuel cells (PEM-FC) environment, according to certain embodiments.
Figure 9B:
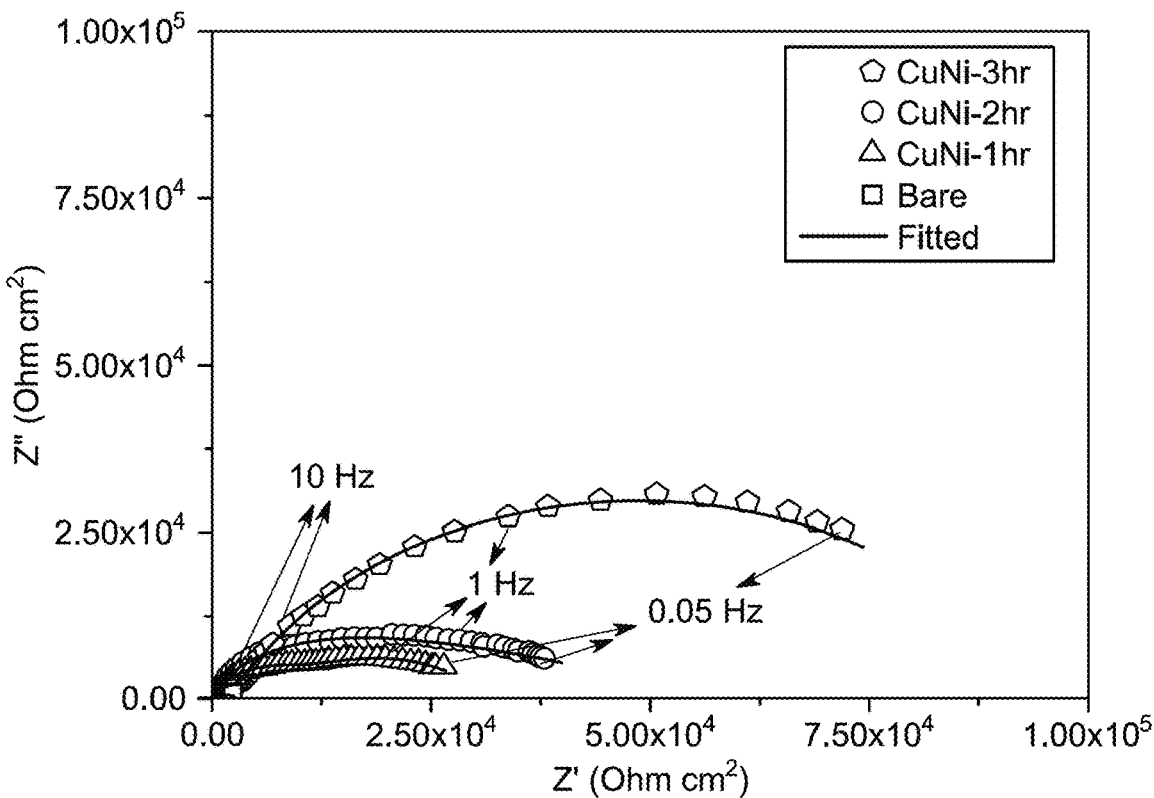
FIG. 9B depicts Nyquist plots of anode for the CuNi alloy-coated SS specimens in an anode PEM-FC environment, according to certain embodiments.
Figure 9C:
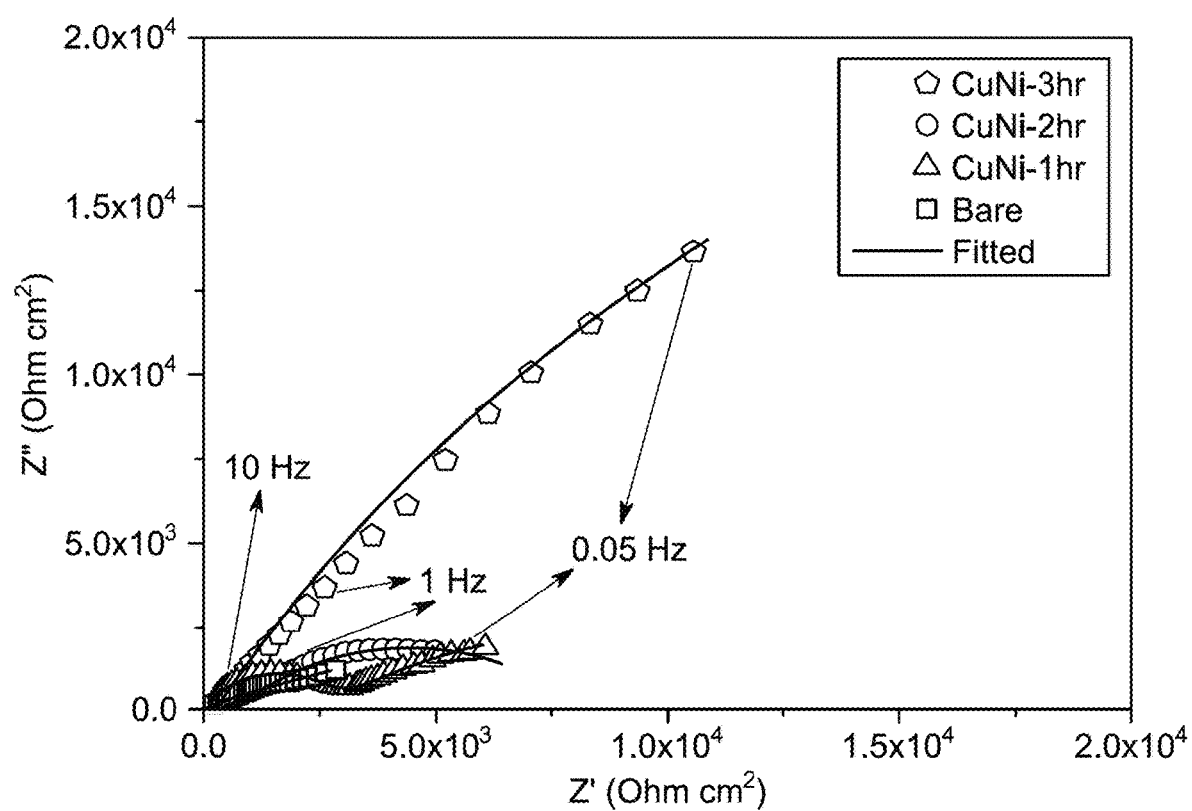
FIG. 9C depicts Nyquist plots of cathode for the CuNi alloy-coated SS specimens in a cathode PEM-FC environment, according to certain embodiments.
Figure 10A:
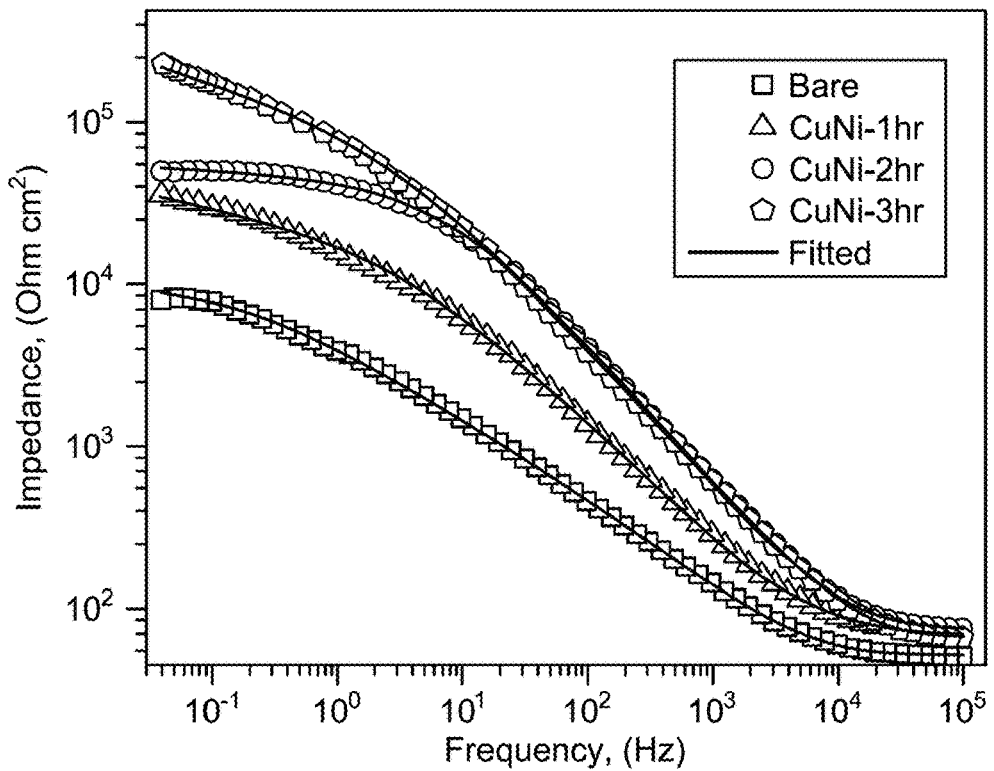
FIG. 10A depicts bode resistance of the CuNi alloy-coated SS specimens at an OCP PEM-FC environment, according to certain embodiments.
Figure 10B:
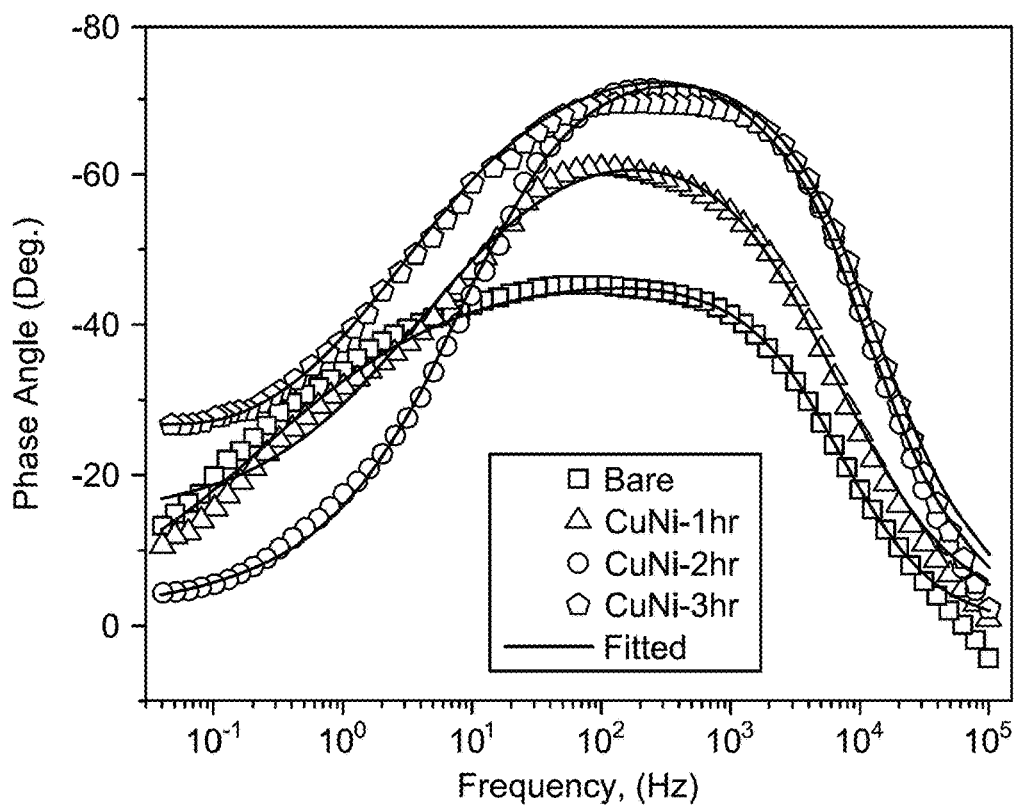
FIG. 10B depicts phase angle plots of the CuNi alloy-coated SS specimens at an OCP PEM-FC environment, according to certain embodiments.
Figure 10C:
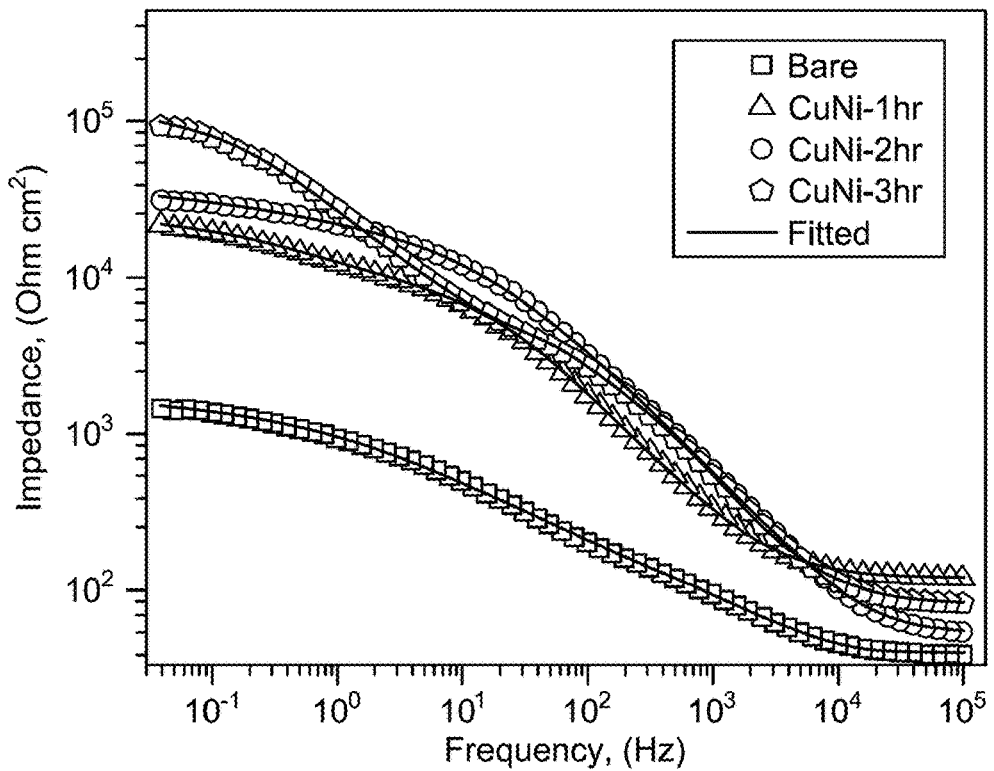
FIG. 10C depicts bode resistance of the CuNi alloy-coated SS specimens at a PEM-FC anodic potential, according to certain embodiments.
Figure 10D:
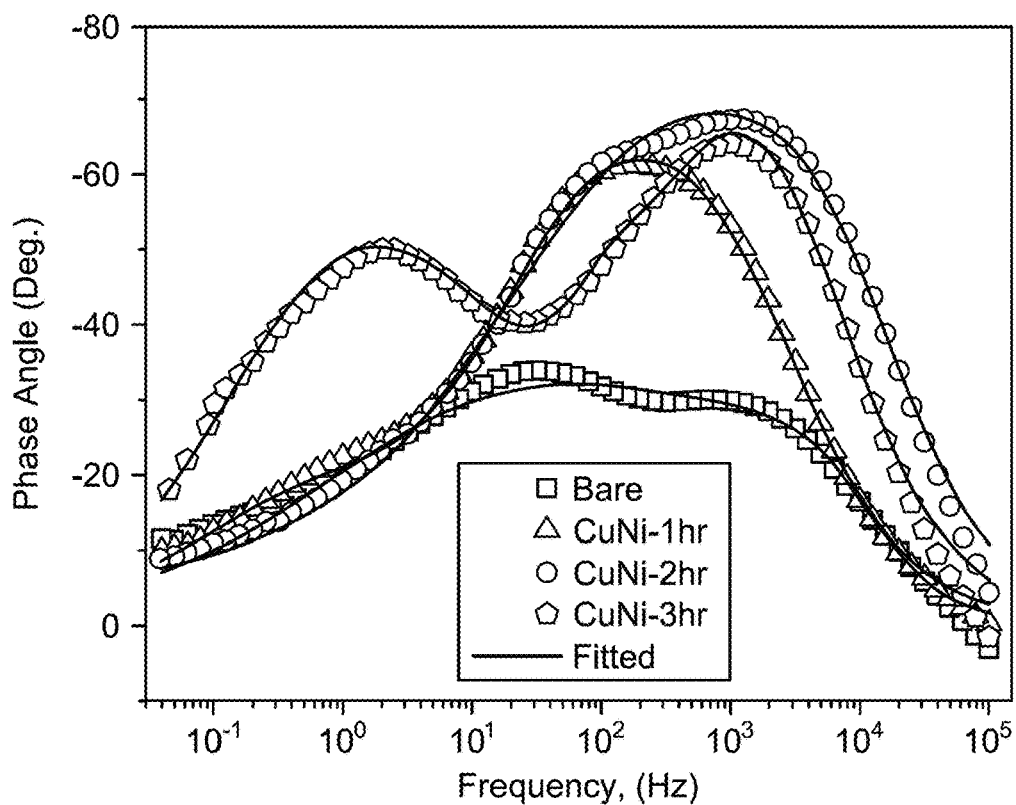
FIG. 10D depicts phase angle plots of the CuNi alloy-coated SS specimens at a PEM-FC anodic potential, according to certain embodiments.
Figure 10E:
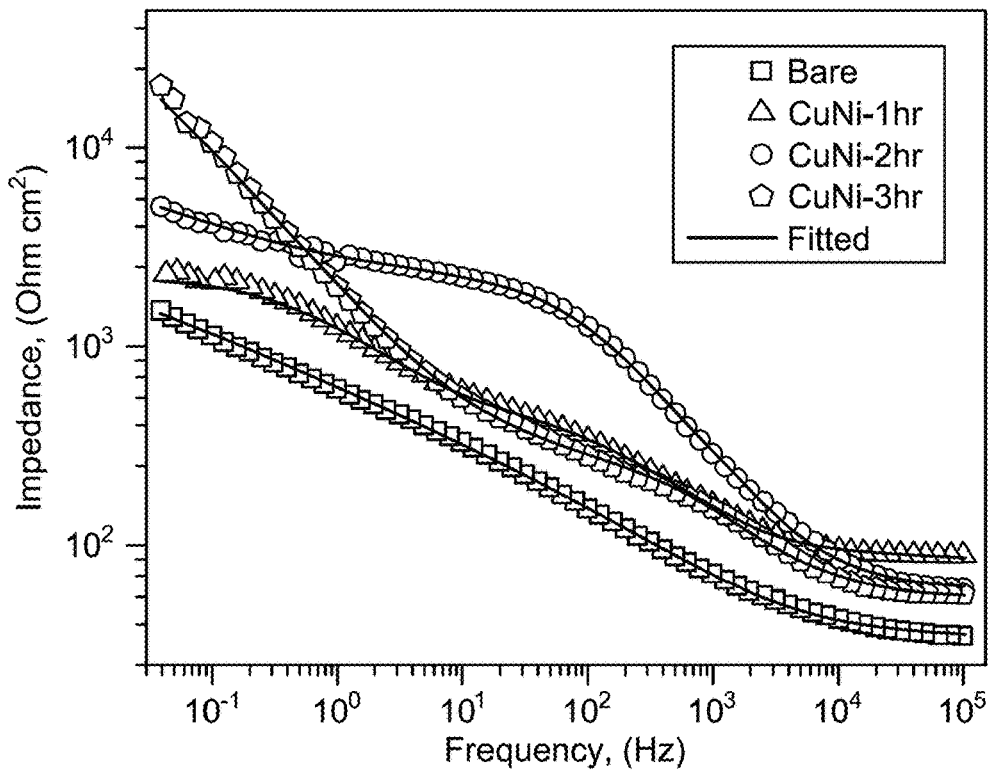
FIG. 10E depicts bode resistance of the CuNi alloy-coated SS specimens at a PEM-FC cathodic potential, according to certain embodiments.
Figure 10F:
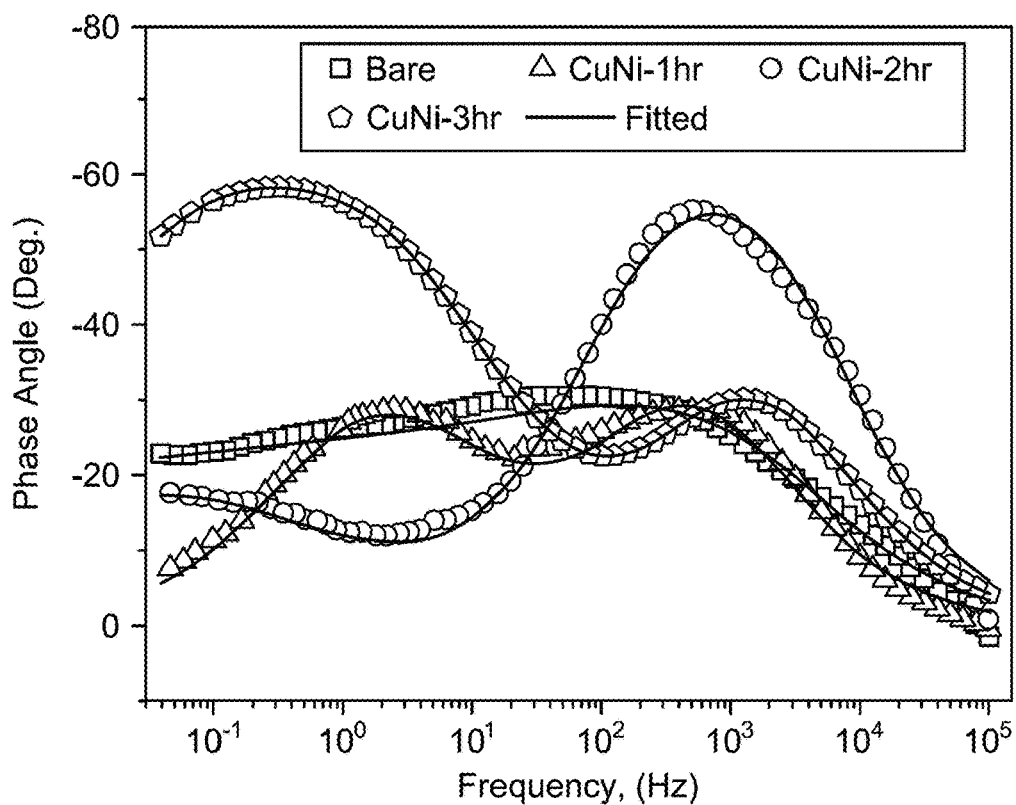
FIG. 10F depicts phase angle plots of the CuNi alloy-coated SS specimens at a PEM-FC cathodic potential, according to certain embodiments.

To obtain clearer evidence of the corrosion process occurring at the bare and coated SS, electrochemical impedance spectroscopic (EIS) tests were carried out under different operating conditions (OCP, PEM-FC anode: −0.1 V, and cathode: +0.6 V) and working potentials. FIG. 9 presents representative Nyquist plots of all the specimens investigated in the open-circuit potential (OCP), PEM-FC anodic, and cathodic environments. The Nyquist graph reveals that the electron transfer reactions on the surface of the coating is governed by the impedance. The larger the diameter of the semi-ellipse, the higher the interference result [*See: Jiang Xu; Hao Jie Huang; Zheng Yang Li; Song Xu; Hongliang Tao; Paul Munroe; Zong-Han Xie. Corrosion behavior of a ZrCN coated Ti alloy with potential application as a bipolar plate for proton exchange membrane fuel cell J. All. Comp.* 2016, 663, 718-730, incorporated herein by reference in its entirety]. As shown in FIG. 9A, the semi-elliptical diameter of the coated specimens at the OCP was significantly larger than that of SS304. Moreover, with increasing deposition time, the semi-elliptical diameter of the specimens increased, demonstrating enhanced corrosion resistance. Furthermore, the diameter of the semi-elliptical arcs decreased when the conditions changed from OCP to PEM-FC anodic and cathodic for both the uncoated and coated SS304 specimens. However, the coated SS specimens exhibited larger semicircle arcs than the bare specimens, indicating improved electrochemical impedance. This observation was possibly accompanied by the production of a passive layer on the CuNi-coated SS, which offered more protection than that generated on bare SS304.

FIG. 10 presents the bode graphs for bare and coated SS under different PEM-FC operating conditions. Generally, the Bode curves at higher frequencies provide specific evidence of solution resistance with surface microdefects, and the data at medium frequencies are associated with the phenomenon occurring within the passive oxide film. Low frequencies are associated with physicochemical processes that ensue instantaneously at the metal/film interface. The Bode impedance at the OCP of the coated SS at lower frequencies was significantly higher than that of the bare specimen. This observation revealed the existence of an inert passive oxide film produced on the coated SS, which acted as a physical barrier between the electrolyte and the SS specimen [*See: Yang, Y.; Nang, X.; Tang, H.; Guo, L.; Liu, H. Effect of passive films on corrosion resistance of uncoated 316L SS bipolar plates for proton exchange membrane fuel cell application. Appl. Sur. Sci.* 2014, 320, 274-280, incorporated herein by reference in its entirety].

By shifting from the OCP to the PEM-FC anodic potential, the impedance of both the uncoated and coated SS304 specimens decreased. The applied anodic potential damaged the passive film formed, causing a further reduction in impedance values and an increase in capacitance values. As the applied potential shifted from the PEM-FC anode to the cathode, the Bode impedance at low frequencies decreased for both uncoated and coated SS specimens. This was ascribed to the deprivation of the oxide film, which permitted more aggressive species into the coating and caused the growth of more rust products on the surface [*See: Pugal Mani, S.; Anandan, C.; Rajendran, N. Formation of a protective nitride layer on 316L SS bipolar plates for proton exchange membrane fuel cell (PEMFC) RSC Adv.* 2015, 5, 64466-70, incorporated herein by reference in its entirety]. This observation proved that the passive oxide layers generated on bare SS304, and the coating was not adequate to provide longer protection because of the aggressive potential stress and operating conditions. However, the passive layer on the coated SS304 further improved the corrosion resistance of the bare specimens. Thus, the CuNi-coated 304 SS displayed improved surface protective performance compared to the bare specimen under the PEM-FC operating conditions.

The change in the Bode phase angle (PA) as the function of the investigated frequency in the Bode curves is generally used to analyze the time constants accompanying EIS curves, as shown in FIG. 10 [*See: Pan, T. J.; Dai, Y. J.; Jiang, J.; Xiang, J. H.; Yang, Q. Q.; Li, Y. S. Anti-corrosion performance of the conductive bilayer CrC/CrN coated 304SS bipolar plate in acidic environment Corros. Sci.* 2022, 206, 110495, incorporated herein by reference in its entirety]. These time constants are directly related to the maxima of the PA curve and are accompanied by capacitance arcs in the Nyquist plots, as shown in FIG. 9. Various features of metallic coatings, including composition, thickness, porosity, surface microstructure, and grain size, may affect the corrosion protection performance in different operating environments [*See: Manso, A. P.; Marzo, F. F.; Xabier Garicano; Cinthia Alegre; Antonio Lozano; Felix Barreras. Corrosion behavior of tantalum coatings on AISI 316L stainless steel substrate for bipolar plates of PEM fuel cells. Int. J. Hydrogen Energy* 2020, 45, 20679-20691, incorporated herein by reference in its entirety]. These features may also be considered when selecting a typical equivalent electric circuit and, thus, describing the related time constants. At the OCP state, the Bode PA curves for the bare and coated SS stretched up to 80° at medium frequencies, revealing the active capacitance performance. At low frequencies, the coated SS showed the highest PA compared to the bare SS, indicating effective hindrance of the corrosion process occurring at the CVD film/solution interface. In the anodic environment, the PA values at low frequencies for both specimens were lower than those attained at the OCP, which was related to the impact of the applied anodic potential. Furthermore, in the cathodic condition, the PA values at low frequencies for both specimens appeared to be less than those observed in the anodic environment.

Figure 11A:
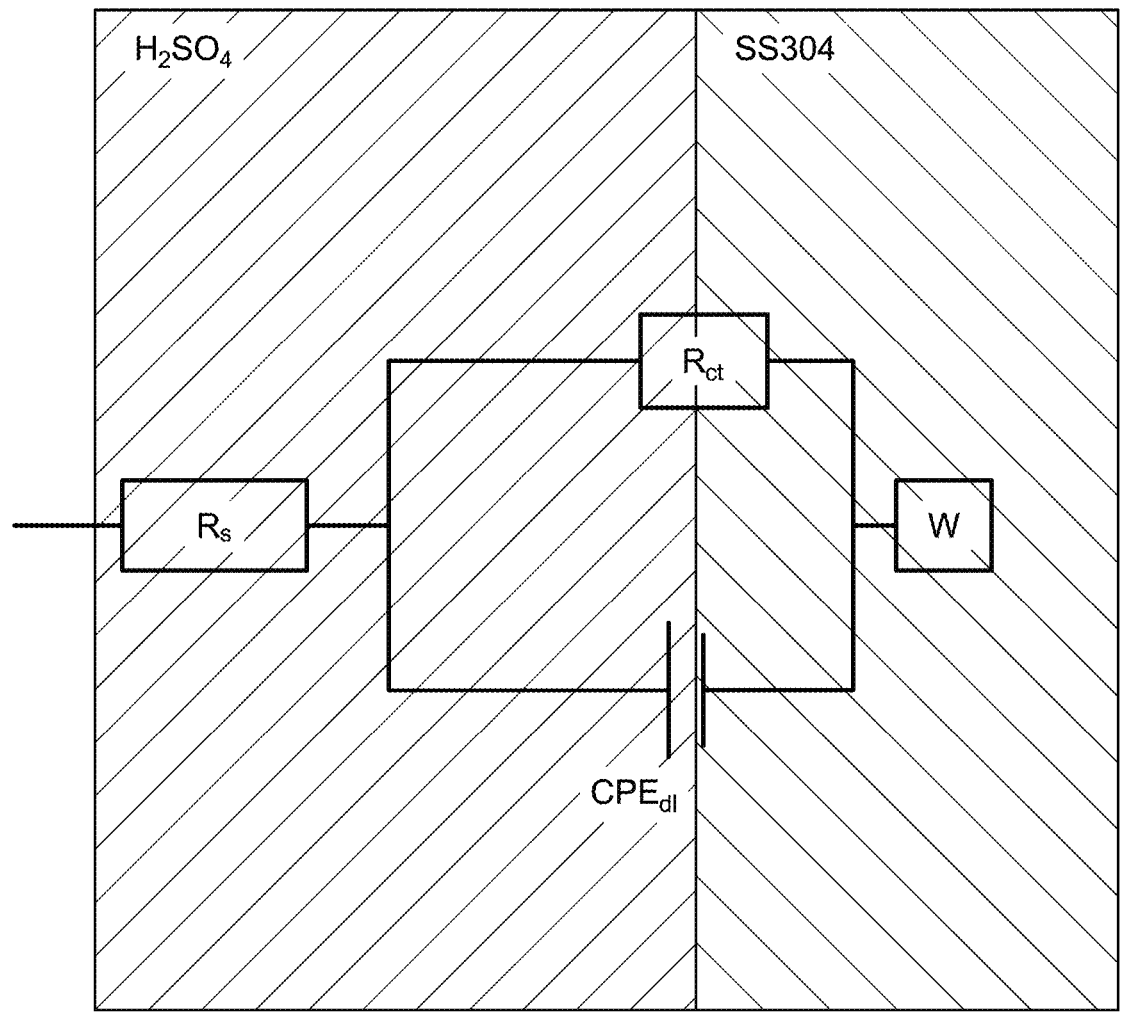
FIG. 11A depicts an electrochemical impedance spectroscopic (EIS) model of bare SS304, according to certain embodiments.
Figure 11B:
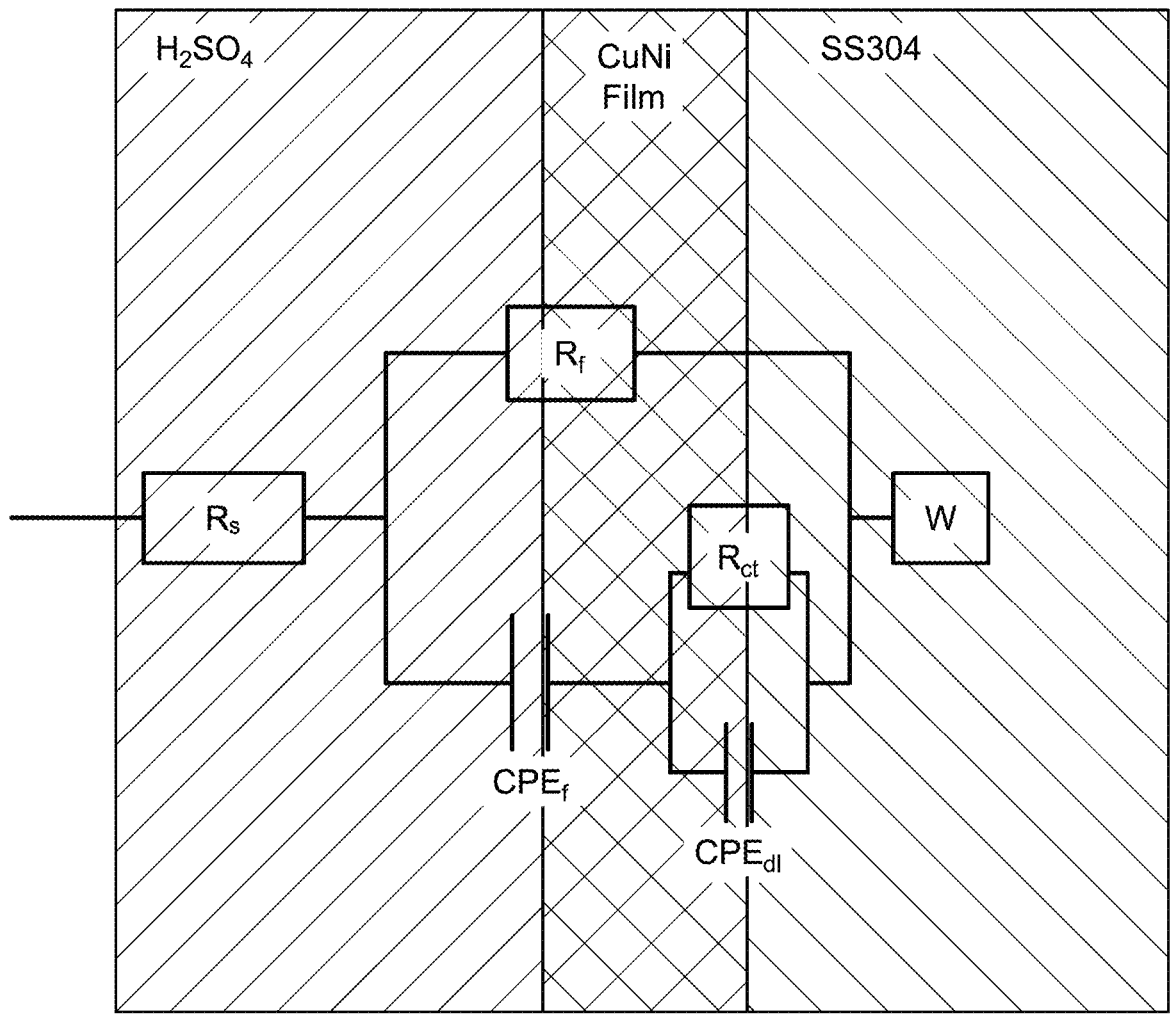
FIG. 11B depicts an EIS model of coated SS304 substrates, according to certain embodiments.

The experimentally attained EIS curves were further investigated by choosing different equivalent circuit models (ECMs) containing a group of electrical circuit elements representing the corrosion process occurring at the interface of the coated SS304 specimens. The EIS data obtained from the bare SS were fitted by an equivalent circuit $R_s$ $(R_{ct}CPE_{dl})$ with one time constant, in which $R_s$ and $R_{ct}$ refer to the electrolytic and charge transfer resistances, respectively, and CPE denotes a constant phase element, related for the capacitance performance behavior of the SS surface, as shown in FIG. 11A [*See: Alexander, C. L.; Tribollet, B.; Mark Orazem, E. Contribution of surface distribution to constant-phase-element (CPE) behavior: II capacitance Electrochim. Acta* 2016, 188, 566-573, incorporated herein by reference in its entirety]. For the CuNi coated SS specimens, the wide peak in the phase angle curves possibly originates from two overlapping time constants related to the two integrated phase maxima in the mid- and low-frequency ranges. Following the investigation, two R-CPE element ECMs $(R_s(CPE_{dl}(R_{ct}(CPE_fR_f))))$ were implemented to simulate the measured EIS data of the CuNi coated SS specimens, as shown in FIG. 11B. Here, the time constant at higher frequencies is accompanied by the $R_{ct}$ and the double-layer capacitance $(C_{dl})$ of the electrochemical reactions at the passive film/electrolytic interface, whereas the time constant at a lower frequency $(CPE_f(R_f)$ is due to the passive film [*See: Madhan Kumar, A.; Muhammad Ali Ehsan; Rami Suleiman, K.; Abbas Saeed Hakeem. Fabrication and characterization of nanostructured AACVD thin films on 316L SS as surface protective layers in simulated body fluid Metall. Mater. Trans. A* 2020, 51, 4301-4312 *and Muhammad Ali Ehsan; Madhan Kumar, A.; Rami Suleiman, K.; Abbas Saeed Hakeem, Fabrication of thickness-con-* trolled NiPd nanoalloy thin films as anticorrosive coatings on 316L SS substrates for application in marine environment *Surf. Coat. Technol.* 2021, 418, 127253, incorporated herein by reference in its entirety]. The simulated data agreed well with the experimentally obtained results and the values of chi-squared ($\chi^2$) ($10^{-4}$~$10^{-5}$), suggesting that the two nominated ECMs evidently replicate the definite electrochemical reactions taking place on the investigated SS specimens in the PEM-FC simulated conditions [*See: Hussein, M. A.; Azeem, M. A.; Madhan Kumar, A.; Saravanan, S.; Ankah, N.; Sorour, A. A. Design and processing of near-b Ti-Nb—Ag alloy with low elastic modulus and enhanced corrosion resistance for orthopedic implants J. Mater. Res. Technol.* 2023, 24, 259-273, incorporated herein by reference in its entirety]. Table 3 summarizes the EIS circuit values obtained from the ECM fitting analysis.

TABLE 3

EIS parameters of the bare and CuNi coated specimens in different PEM-FC environments

| | Anode | | | Cathode | | |
|---|---|---|---|---|---|---|
| Substrate | $R_{ct}$, $\Omega$ $cm^2$ | $Q_{dl}$, $\mu\Omega^{-1}cm^{-2} \cdot s^n$ | $n_{dl}$ | $R_{ct}$, $\Omega$ $cm^2$ | $Q_{dl}$, $\mu\Omega^{-1}cm^{-2} \cdot s^n$ | $n_{dl}$ |
| Bare | 1490 | 12.567 | 0.92 | 1197 | 86.298 | 0.89 |
| CuNi-1 h | 21250 | 0.975 | 0.94 | 2445 | 29.324 | 0.9 |
| CuNi-2 h | 32216 | 0.678 | 0.95 | 5050 | 12.398 | 0.9 |
| CuNi-3 h | 92567 | 0.129 | 0.97 | 20790 | 3.235 | 0.96 |

The comparison of the $CPE_{dl}$ and $R_{ct}$ values in various environments (OCP, anode, and cathode) indicates that the coated SS304 had higher corrosion resistance at each potential. Moreover, the PEM-FC anode and cathode conditions further increased the low $CPE_{dl}$ obtained for bare and coated SS at the OCP. This is caused by the passive film thinning due to the polarized potential increase from a lower to a higher value, in addition to charge accumulation from corrosion reactions [*See: Madhan Kumar, A; Rajendran, N. Influence of zirconia nanoparticles on the surface and electrochemical behavior of polypyrrole nanocomposite coated 316L SS in simulated body fluid Surf. Coat. Technol.* 2012, 213, 155-166, incorporated herein by reference in its entirety]. The $CPE_f$ values gradually increased as the applied potential shifted from the PEM-FC anode to the cathodic conditions. However, no noteworthy change was observed owing to the impact of the polarized potential. These findings show that the coated SS provides greater surface protection at higher potential loads, such as the +0.6 V PEM-FC cathode working potential.

Figure 12A:
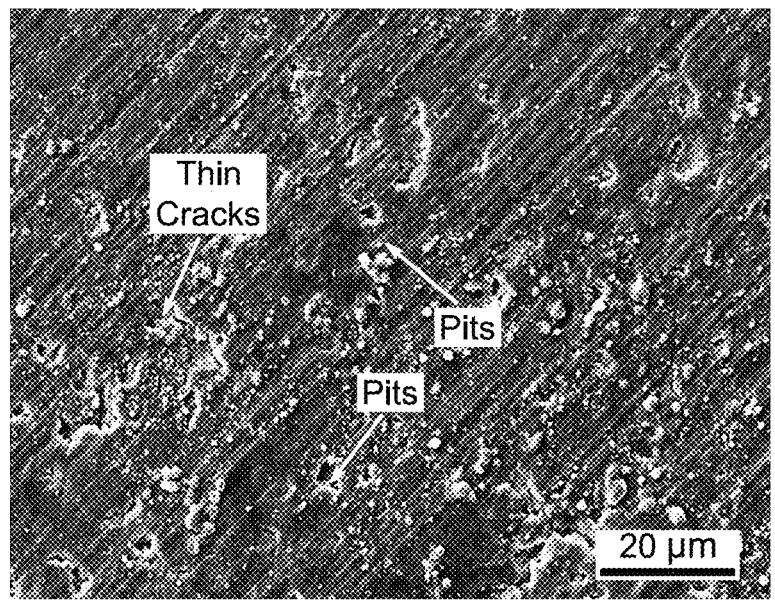
FIG. 12A depicts a SEM image of bare and coated SS304 substrates after corrosion tests in a PEMFC bare-anodic environment, according to certain embodiments.
Figure 12B:
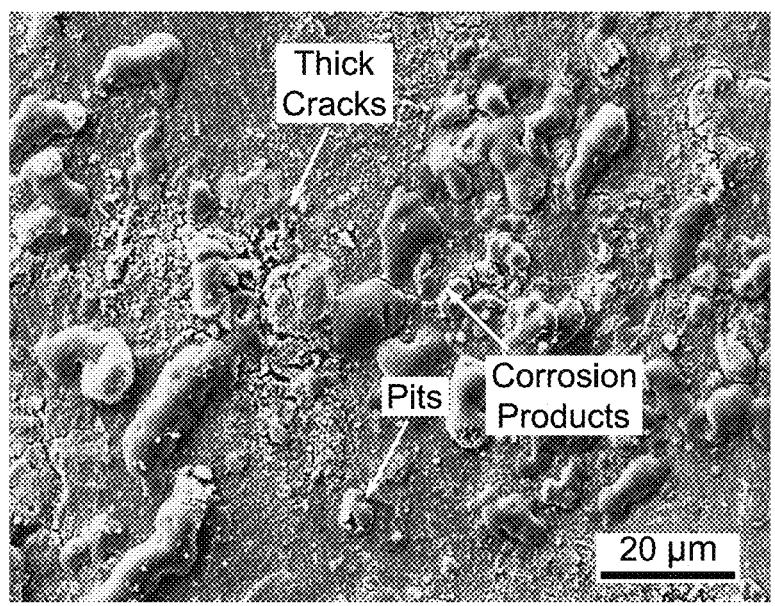
FIG. 12B depicts a SEM image of bare and coated SS304 substrates after corrosion test in a PEMFC bare-cathodic environment, according to certain embodiments.
Figure 12C:
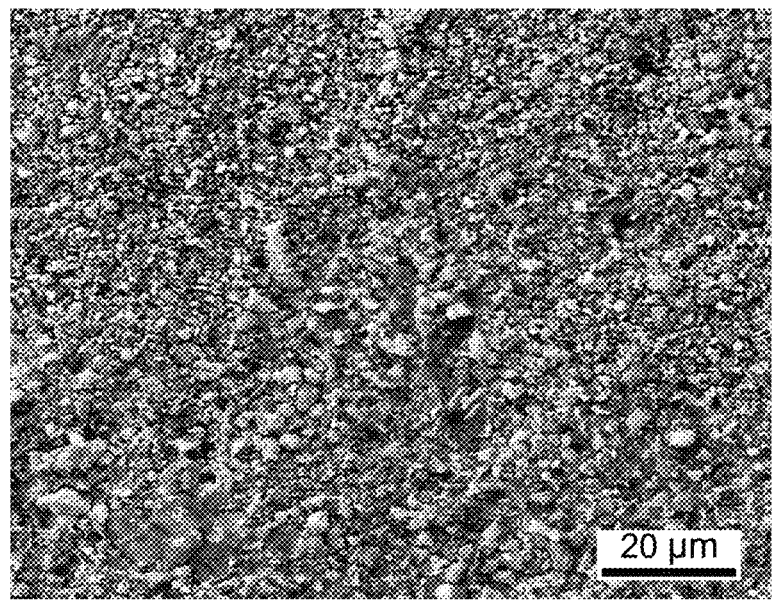
FIG. 12C depicts a SEM image of bare and coated SS304 substrates after corrosion test in a PEMFC CuNi-3 hr sample-anodic environment, according to certain embodiments.
Figure 12D:
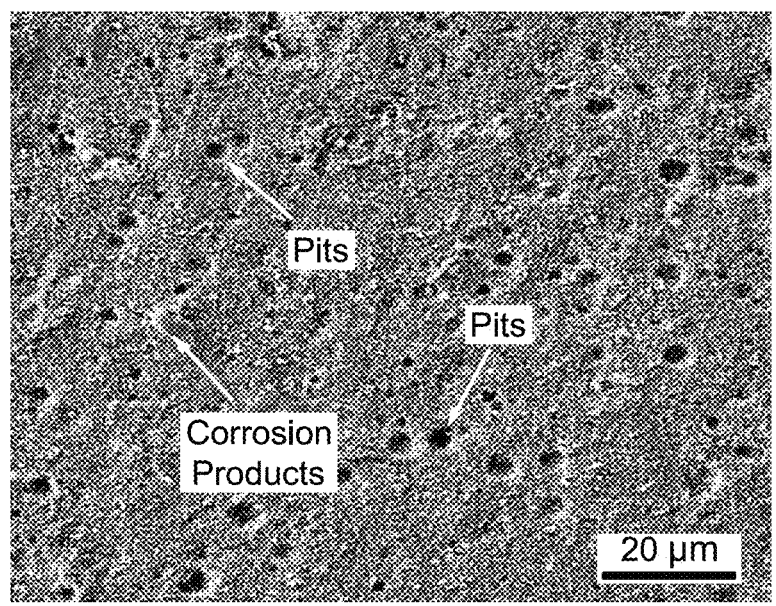
FIG. 12D depicts a SEM image of bare and coated SS304 substrates after corrosion test in a PEMFC CuNi-3 hr sample-cathodic environment, according to certain embodiments.

SEM images of bare and CuNi-3 hr coated SS304 specimens in both anodic and cathodic conditions are shown in FIGS. 12A-12D. At anodic environment, the surface of bare SS304 specimen exhibited few microdefects such as cracks and pits due to the corrosion reactions occurring at metal/electrolytic interface. However, at the cathodic conditions, the formed passive film was aggressively destroyed, leading to the formation of more microdefects on the surface with the accumulation of corrosion products, as shown in FIG. 12B. In contrast, CuNi-3 hr coated SS304 specimen showed nearly defect and crack free surface in anode environment, as shown in FIG. 12C. However, at cathodic conditions, it exhibited the micro defects and cracks on the surface, indicating the reduction in corrosion resistance between the CuNi film/electrolyte interface. Variations in the PEMFC anode to cathode environment led to a reduction in the stability of the passive film due to an increased number of defects and cracks. However, compared to the bare SS304, the CuNi coated SS still had higher corrosion resistance due to the presence of oxide films of CuNi alloy on the surface. The SEM results revealed the high corrosion resistance provided by the CuNi films in both the anodic and cathodic conditions. The results obtained are well agreed with EIS and PDP investigations.

In addition to the corrosion resistance characteristics of BPs, ICR is a significant parameter that governs the energy efficiency of PEM-FC BPs. In general, a high ICR value may result in reduced power output owing to undesirable ohmic loss and reduce the lifespan of the PEM-FC [*See: Shuang Peng; Jiang Xu; Zong-Han Xie; Paul Munroe. Titanium bipolar plates augmented by nanocrystalline TiZrHfMoW coatings for application in proton exchange membrane fuel cells Appli. Sur. Sci.* 2022, 591, 153200, incorporated herein by reference in its entirety]. Thus, to evaluate the impact of the CuNi coating on the electrical conductivity of SS specimens, the ICRs of the bare and coated SS304 specimens under 150 newton per centimeter (N $cm^{-2}$) were measured before and after PST testing.

Figure 13:
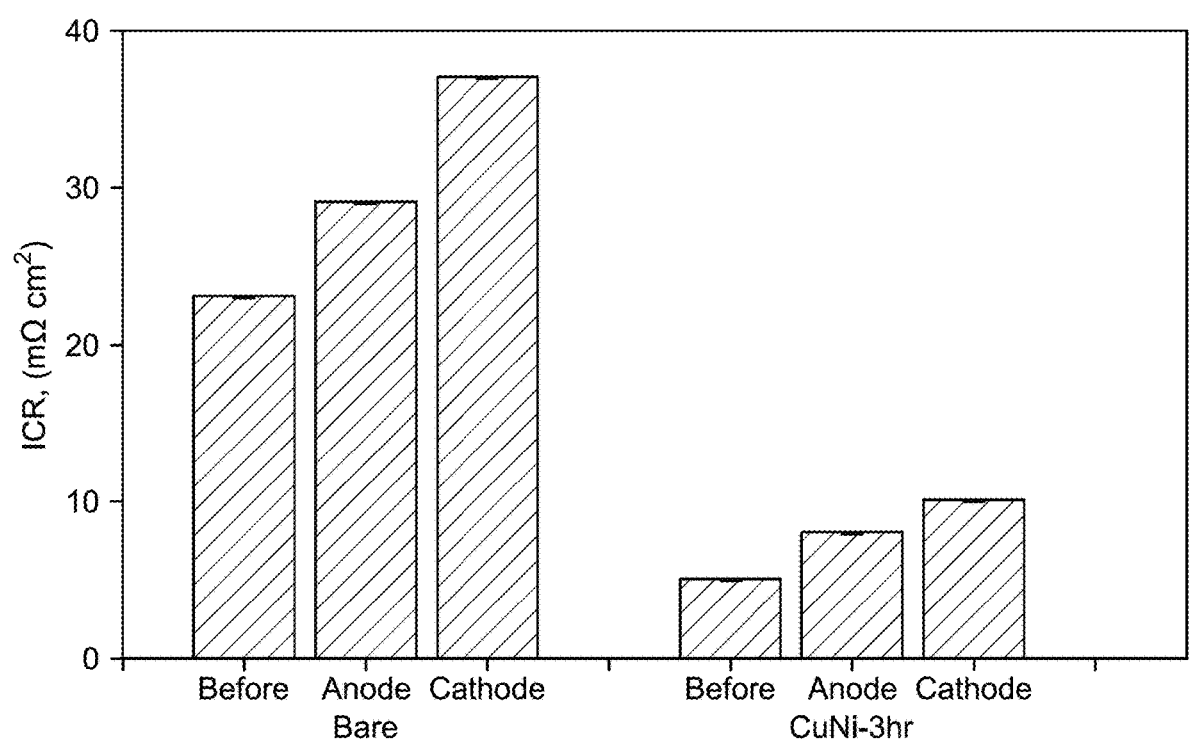
FIG. 13 depicts interfacial contact resistance (ICR) test results for the bare and coated 304SS specimens before and after PST testing, according to certain embodiments.

The results shown in FIG. 13 indicate that the CuNi coating has a lower ICR value than the bare SS, demonstrating better electrical conductivity for the CuNi coated SS-processed CVD route. The ICR value of the bare SS was found to be approximately 23 milliohm square centimeter ($m\Omega$ $cm^2$), whereas that of the coated SS304 was 5 $m\Omega$ $cm^2$. The lower ICR of SS304 with the CVD coating was due to the presence of highly conductive CuNi films. At an anodic potential of −0.1 V, the ICR values of both bare and coated SS304 increased due to the passive film formed on the surface under anodic conditions [*See: Zhihao Chen; Guohui Zhang; Wenzhong Yang; Bin Xu; Yun Chen; Xiaoshuang Yin; Ying Liu. Superior conducting polypyrrole anti-corrosion coating containing functionalized carbon powders for 304 stainless steel bipolar plates in proton exchange membrane fuel cells Chem. Eng. J.* 2020, 393, 124675, incorporated herein by reference in its entirety]. At a cathodic potential of +0.6 V, a further rise in the ICR values was obtained for both specimens. In the cathodic environment, both samples underwent corrosion, which led to higher ICR values. However, the minor corrosion on the coated SS304 caused a reduction in the ICR compared to the bare electrode in both the PEM-FC anodic and cathodic environments.

In the present disclosure, CuNi alloy coatings of varying thicknesses were successfully deposited onto SS304 using AA-CVD. The structural characterization of the CuNi alloy confirmed the formation of homogeneous, compact, and crack-free coatings having a thickness of around 1 μm-2 μm. The CuNi coating positively shifted the corrosion potential value of SS304 in both cathodic and anodic conditions, with an evident reduction in the relevant $i_{corr}$ values by two orders of magnitude compared to that of the bare specimen, validating the efficient corrosion resistance characteristics of the CuNi films. Specifically, the impedances of the CuNi-3 h coated SS specimens were pointedly higher than those of the other specimens in the PEM-FC environments. These findings were ascribed to the strong electrochemical stability of the CuNi film, which allowed it to act as a physical barrier, hindering the corrosion of the BPs by the permeation of harsh species from the acidic environment. The ICR of the CuNi-3 h coated SS304 was found to be approximately 5 $m\Omega$ $cm^2$ under 150 N $cm^{-2}$, validating that the coating had higher conductivity. All the obtained results collectively confirm that CuNi coatings may be used in metal BPs for PEM-FC applications.

The fabricated CuNi alloy coatings were homogeneous, dense, and crack-free, with a thickness range of 1 μm-2 μm. Further, the corrosion-resistant performance of CuNi-coated SS304 specimens was investigated in a PEM-FC operating simulated environment, and the results indicated that CuNi coatings developed for 3 h demonstrated the strongest surface protective activity with the lowest corrosion current density (0.125 μA cm$^2$) and highest impedance values (92567 Ω cm$^2$) in both PEM-FC operating cathode and anode conditions. The deposition of CuNi alloy films significantly reduced the interfacial contact resistance (ICR), and the CuNi-3 h coating achieved a low ICR of 5 mΩ cm$^2$ under a compaction force of 150 N cm$^{-2}$. Detailed electrochemical characterization confirmed that the CuNi alloy coating has significant potential for use as a protecting coating for PEM-FC SS bipolar plates.

Numerous modifications and variations of the present disclosure are possible in light of the above teachings. It is therefore to be understood that within the scope of the appended claims, the invention may be practiced otherwise than as specifically described herein.

The invention claimed is:

1. A method of depositing a bimetallic alloy coating onto a bare stainless-steel bipolar plate, comprising:
    preheating the bare stainless-steel bipolar plate to a temperature of 450 to 500° C.;
    depositing Cu and Ni onto the bare stainless-steel bipolar plate to form a coated stainless-steel bipolar plate,
    wherein the depositing is aerosol assisted chemical vapor deposition of Cu and Ni from a solution containing a mixture of a copper (II) precursor and a nickel (II) precursor to form the coated stainless-steel bipolar plate having a coating comprising a CuNi film having a metal phase consisting of Cu, Ni and CuNi.

2. The method of claim 1, wherein the bimetallic alloy coating exhibits an island-like topographical structure having a grain boundary defining the island-like topographical structure.

3. The method of claim 1, wherein the copper (II) precursor is at least one selected from the group consisting of copper trifluoroacetylacetonate, copper hexafluoroacetylacetonate, copper dimethyldithiocarbamate, copper bis(2-hydroxyethyl)dithiocarbamate, copper diethyl-dithiocarbamate and copper acetylacetonate, and
    wherein the nickel (II) precursor is at least one selected from the group consisting of nickel nitrate, nickel chloride, nickel sulfate, nickel acetate, nickel (II) bis(triphenylphosphine)dichloride, nickel acetylacetonate, and nickelocene, and
    wherein the depositing is 1 to 3 hours, followed by cooling the coated stainless-steel bipolar plate after terminating the depositing.

4. The method of claim 1, wherein the CuNi film has a thickness of 0.5 to 2.5 μm.

5. The method of claim 1, wherein the CuNi film contains a plurality of cubic crystal units.

6. The method of claim 1, wherein the CuNi film comprises a compact microstructure in cross-sectional area.

7. The method of claim 1, wherein copper in the CuNi film is present with a molar percentage range from 40 to 48%, and
    nickel is present in the CuNi film nickel with a molar percentage range from 40 to 48%, based on the total number of atoms in the CuNi film.

8. The method of claim 1, wherein the CuNi film has a surface roughness measured as average value of profile deviation from the mean line in AFM at a range of 0.008 to 0.030 μm.

9. The method of claim 1, wherein the CuNi film has a surface roughness measured as root mean square deviation of profile in AFM at a range of 1.5 to 4.5 μm.

10. The method of claim 1, wherein the coated stainless-steel bipolar plate has a homogenous CuNi film measured as an average peak to valley height in AFM at a range of 1.5 to 3 μm.

11. The method of claim 1, wherein the coated stainless-steel bipolar plate exhibits an anode corrosion potential ($E_{corr}$) at a range of −0.016 to −0.014V under a proton exchange membrane fuel cell anodic operating environment, and
    wherein the coated stainless-steel bipolar plate exhibits a cathode corrosion potential ($E_{corr}$) at a range of −0.032 to −0.005V under a proton exchange membrane fuel cell cathodic operating environment.

12. The method of claim 1, wherein the coated stainless-steel bipolar plate exhibits an anode corrosion current density at a range of 0.14 to 0.18 μA cm$^{-2}$ under the proton exchange membrane fuel cell anodic operating environment and
    wherein the coated stainless-steel bipolar plate exhibits a cathode corrosion current density at a range of 0.12 to 0.85 μA cm$^{-2}$ under the proton exchange membrane fuel cell cathodic operating environment.

13. The method of claim 1, wherein the coated stainless-steel bipolar plate exhibits a compulsory current density less than 1 μA/cm$^2$ under the proton exchange membrane fuel cell anodic operating environment and the proton exchange membrane fuel cell cathodic operating environment.

14. The method of claim 1, wherein the coated stainless-steel bipolar plate has a surface without visible defects and cracks in the proton exchange membrane fuel cell anodic operating environment.

15. The method of claim 1, wherein the coated stainless-steel bipolar plate exhibits an anode impedance at a range of 2×10$^4$ to 1×10$^5$ Ω cm$^2$ under the proton exchange membrane fuel cell anodic operating environment, and
    wherein the coated stainless-steel bipolar plate exhibits a cathode impedance at a range of 2×10$^3$ to 3×10$^4$ Ω cm$^2$ under the proton exchange membrane fuel cell cathodic operating environment.

16. The method of claim 1, wherein the coated stainless-steel bipolar plate exhibits an interfacial contact resistance (ICR) at a range of 5 to 10 mΩ cm$^2$ under a compaction force at a range of 100 to 200 N cm$^{-2}$.

17. A proton exchange membrane fuel cell, comprising:
    a plurality of membrane electrode assemblies each having an anode and a cathode separated by a proton exchange membrane;
    a plurality of gas diffusion layers;
    a plurality of coated stainless-steel bipolar plates having a microgranular bimetallic alloy coating,
    wherein the coated stainless-steel bipolar plates are obtained by a process comprising:
    preheating a bare stainless-steel bipolar plate to a temperature of 450 to 500° C.;
    depositing Cu and Ni onto the bare stainless-steel bipolar plate to form the coated stainless-steel bipolar plate,
    wherein the depositing is aerosol assisted chemical vapor deposition of Cu and Ni from a solution containing a mixture of a copper (II) precursor and a nickel (II) precursor for 1 to 3 h to form the coated stainless-steel bipolar plate having a coating comprising a CuNi film having a metal phase consisting of Cu, Ni and CuNi;

cooling the coated stainless-steel bipolar plate after terminating the depositing, and wherein the microgranular bimetallic alloy coating exhibits an island-like topographical structure having a grain boundary.

18. The proton exchange membrane fuel cell of claim 17, wherein the coated stainless-steel bipolar plates are conductive and have a bimetallic alloy coating layer consisting of Cu, Ni and CuNi.

19. The proton exchange membrane fuel cell of claim 17, wherein each of the membrane electrode assemblies is sandwiched by two gas diffusion layers, further sandwiched by two coated stainless-steel bipolar plates.

20. The proton exchange membrane fuel cell of claim 17, further comprising a fuel cell stack having the proton exchange membrane fuel cell each connected via contact of the coated stainless-steel bipolar plates.

* * * * *